US006964903B2

(12) United States Patent
Forbes et al.

(10) Patent No.: US 6,964,903 B2
(45) **Date of Patent: *Nov. 15, 2005**

(54) METHOD OF FABRICATING A TRANSISTOR ON A SUBSTRATE TO OPERATE AS A FULLY DEPLETED STRUCTURE

(75) Inventors: Leonard Forbes, Corvallis, OR (US); Wendell P. Noble, Jr., Milton, VT (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 10/057,225

(22) Filed: Jan. 25, 2002

(65) Prior Publication Data

US 2002/0081808 A1 Jun. 27, 2002

Related U.S. Application Data

(60) Continuation of application No. 09/560,777, filed on Apr. 28, 2000, now Pat. No. 6,413,825, which is a division of application No. 09/145,100, filed on Sep. 1, 1998, now Pat. No. 6,104,068.

(51) Int. Cl.[7] .............................................. H01L 21/336

(52) U.S. Cl. ....................... 438/283; 438/268; 438/212; 438/157

(58) Field of Search ................................ 438/157, 283, 438/268, 269, 279, 212, 156

(56) References Cited

U.S. PATENT DOCUMENTS

| | | | | | |
|---|---|---|---|---|---|
| 4,287,083 | A | | 9/1981 | McDowell et al. | 252/182 |
| 4,605,909 | A | | 8/1986 | Tsironis | 331/96 |
| 4,680,853 | A | * | 7/1987 | Lidow et al. | 438/268 |
| 5,006,909 | A | | 4/1991 | Kosa | 357/23.6 |
| 5,057,896 | A | | 10/1991 | Gotou | 357/49 |
| 5,308,782 | A | * | 5/1994 | Mazure et al. | 438/156 |
| 5,391,895 | A | | 2/1995 | Dreifus | 257/77 |
| 5,585,288 | A | | 12/1996 | Davis et al. | 438/174 |
| 5,661,424 | A | | 8/1997 | Tang | 327/105 |
| 5,675,164 | A | | 10/1997 | Brunner et al. | 257/331 |
| 5,804,848 | A | * | 9/1998 | Mukai | 257/270 |
| 5,998,834 | A | | 12/1999 | Williams et al. | 257/330 |
| 6,060,746 | A | | 5/2000 | Bertin et al. | 257/331 |
| 6,097,065 | A | * | 8/2000 | Forbes et al. | 257/350 |
| 6,150,687 | A | * | 11/2000 | Noble et al. | 257/302 |
| 6,320,222 | B1 | * | 11/2001 | Forbes et al. | 257/331 |

FOREIGN PATENT DOCUMENTS

| | | | |
|---|---|---|---|
| JP | 60-116163 | 6/1985 | H01L/27/08 |
| JP | 4370978 | 12/1992 | H01L/29/784 |

OTHER PUBLICATIONS

GaAs *IC Symposium, IEEE Gallium Arsenide Integrated Cisuit Symposium, 19th Annual Technical Digest*, Anaheim, California, pp. 1–290, (Oct. 12–15, 1997).

Asai, S., et al., "The GaAs Dual–Gate Fet With Low Noise And Wide Dynamic Range", *Technical Digest, International Electron Devices Meeting*, pp. 64–67, (Dec. 1973).

(Continued)

*Primary Examiner*—Michael Trinh

(74) *Attorney, Agent, or Firm*—Schwegman, Lundberg, Woessner & Kluth, P.A.

(57) ABSTRACT

A method provides a structure that includes dual-gated metal-oxide semiconducting field effect transistor (MOSFET). The dual-gated MOSFET can be fabricated according to current CMOS processing techniques. The method includes forming a body region of the dual-gated MOSFET as a fully depleted structure. The structure includes two gates which are positioned on opposite sides of the opposing sides of the body region. Further, the structure operates as one device where the threshold voltage of one gate depends on the bias of the other gate. Thus, the structure yields a small signal component in analog circuit applications which depends on the product of the signals applied to the gates, and not simply one which depends on the sum of the two signals.

38 Claims, 26 Drawing Sheets

OTHER PUBLICATIONS

Colinge, J.P., "Reduction of Kink Effect in Thin–Film SOI MOSFET's", *IEEE Electron Device Letters*, 9 (2), pp. 97–99, (1988).

Denton, J.P., et al., "Fully Depleted Dual–Gated Thin–Film SOI P–MOSFET's Fabricated in SOI Islands with an Isolated Buried Polysilicon Backgate", *IEEE Electron Device Letters*, 17 (11), pp. 509–511, (Nov.1996).

Mizuno, T., et al., "High Speed and Highly Reliable Trench MOSFET with Dual–Gate", 1988 *Symposium on VLSI Technolgy, Digest of Technical Papers*, pp. 23–24, 991, (1988).

Nishinohara, K., et al., "Effects of Microscopic Fluctuations in Dopant Distributions on MOSFET Threshold Voltage", *IEEE Transactions on Electron Devices*, 39 (3), pp. 634–639, (Mar. 1992).

Stolk, P.A., et al., "The Effect of Statistical Dopant Fluctuations on MOS Device Performance", *IEEE*, pp. 23.4.1–23.4.4, (1996).

Sze, S.M., *In: Physics of Semiconductor Devices, Second Edition*, Wiley–Interscience Publications, John Wiley & Sons, New York, p. 362–279, 433–338, (1981).

Takeuchi, K., et al., "Channel Engineering for the Reduction of Random–Dopant–Placement–Induced Theshold Voltage Fluctuations", *IEEE*, pp. 33.6.1–33.6.4, (1997).

Taur, Y., et al., "CMOS Devices below 0.1 micrometer: How High Will Performance Go?", *IEEE*, pp. 9.1.1–9.1.4, (1997).

Wong, H.S., et al., "Self–Aligned (Top and Bottom) Double-Gate MOSFET with a 25 nm Thick Silicon Channel", *IEEE*, pp. 16.6.1–16.6.4, (1997).

Wong, H.S., et al., "Three–Dimensional "Atomistic" Simulation of Discrete Random Dopant Distribution Effects in Sub–0.1 micrometer MOSFET's", *IEEE*, pp. 29.2.1–29.2.4, (1993).

* cited by examiner

METHOD OF FABRICATING A TRANSISTOR ON A SUBSTRATE TO OPERATE AS A FULLY DEPLETED STRUCTURE

RELATED APPLICATIONS

This application is a Continuation of U.S. Ser. No. 09/560,777, filed Apr. 28, 2000, now issued as U.S. Pat. No. 6,413,825 Jul. 2, 2002, which is a Divisional of U.S. Ser. No. 09/1 45,100, filed Sept. 1, 1998, now issued as U.S. Pat. No. 6,104,068 Aug. 15, 2000, which are incorporated herein by reference.

This application is related to the co-filed and commonly assigned application U.S. application Ser. No. 09/144,202, now U.S. Pat. No. 6,320,222, entitled "Structure and Method for Reducing Threshold Voltage Variations Due To Dopant Fluctuations" by inventors Leonard Forbes and Wendell P. Noble, which is hereby incorporated by reference. Further, this application is related to application Ser. No. 08/889,462, entitled "Memory Cell Having A Vertical Transistor with Buried Source/Drain And Dual Gates," filed on Jul. 8, 1997, now U.S. Pat. No. 6,150,687, and application Ser. No. 09/050,281, entitled "Circuits and Methods for Dual-Gated Transistors," filed on Mar. 30, 1998, now U.S. Pat. No. 6,097,065, which applications are also incorporated herein by reference.

FIELD OF THE INVENTION

The present invention relates generally to semiconductor integrated circuits. More particularly, it pertains to the structure and method for improved signal processing.

BACKGROUND OF THE INVENTION

There is a requirement in analog and radio frequency (RF) integrated circuits for devices known as mixers or multipliers which can take the product of two signals, not just the sum or difference as in simple analog amplifiers or analog computers. This enables the construction of variable gain amplifiers, modulators, heterodyne receivers, frequency multipliers, frequency dividers, synthesizers, and a wide variety of other signal processing functions.

Integrated circuits, such as mixers and multipliers, require the use of a nonlinear solid state device. The simplest nonlinear device employed in a signal mixer or multiplier is the diode such as used in TV satellite receivers. The nonlinear characteristics of the diode are used to obtain an intermediate frequency from the product of a local oscillator frequency and an input signal frequency. This product yields, besides the original signals, signals at the sum and differences of the local oscillator frequency and an input signal frequency. The intermediate signal frequency at the difference of the local oscillator frequency and an input signal frequency is used for down conversion of the input signal frequency to lower frequencies where it can then be more easily amplified and demodulated to remove the useful information.

Transistors are also used to fabricate integrated circuits which have the mixer and multiplier capability. Often metal-semiconductor field effect transistors (MESFET's) are employed as the nonlinear solid state device. The MESFET is typically referred to as a dual gate FET, as used in RF GaAs integrated circuits. The device structure can be understood in simple terms by considering it to be two FETs in series where dual gates of the MESFET are adjacent to each other and in series between the source and drain. Further, the drain of the first or lower transistor is in contact, internally, with the source of the upper or top device and there is no external contact to this point. The action of this device can be understood by realizing the gate to source voltage of the second or top device depends on the biasing of the gate to source voltage of the lower or bottom device. This results in the operation depending on the product of the signals on the two gates. Such GaAs dual gate FETs are typically used in a wide variety of signal processing functions at high frequencies, e.g., in the gigahertz (GHz) range including, most recently, cellular or wireless telephones.

Wireless or cellular telephones provide a good example of the shortcomings with using MESFETs in digital technology applications. That is, such digital devices require the integration of both RF and digital integrated circuit functions. Integrating analog and digital circuitry requires significant circuitry real estate and involves non-analogous fabrication steps. The push in integrated circuit technology is to develop more and more compact devices through simplified processing routines. It would be ideal to incorporate both analog and digital functions on a single chip while at the same time maintaining streamlined fabrication processes. Thus, there is a need for RF and digital integrated circuits which can be implemented on a single integrated circuit chip, e.g., a single complementary metal oxide semiconductor (CMOS) integrated circuit chip, using analogous fabrication techniques.

SUMMARY OF THE INVENTION

The above-mentioned problems with integrated circuits and other problems are addressed by the present invention and will be understood by reading and studying the following specification. A structure and method which offer improved functionality are provided. In an embodiment, a method includes fabricating a transistor on a substrate including vertically forming a body region to operate as a fully depleted structure.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION

Figure 1B:
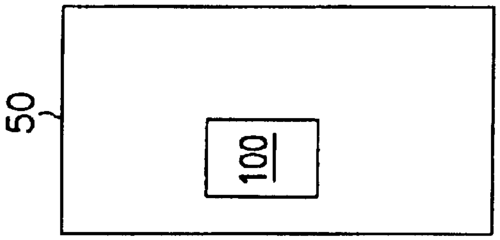
FIG. 1B is a block diagram illustrating the incorporation of the RF circuit of FIG. 1A into a signal processing integrated circuit 50 according to the teachings of the present invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

The term "horizontal" as used in this application is defined as a plane parallel to the conventional plane or surface of a wafer or substrate, regardless of the orientation of the wafer or substrate. The term "vertical" refers to a direction perpendicular to the horizonal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate.

Throughout this specification the designation "n+" refers to semiconductor material that is heavily doped n-type semiconductor material, e.g., monocrystalline silicon or polycrystalline silicon. Similarly, the designation "p+" refers to semiconductor material that is heavily doped p-type semiconductor material. The designations "n−" and "p−" refer to lightly doped n- and p-type semiconductor materials, respectively.

In particular, an illustrative embodiment of the present invention includes a mixer circuit. The mixer circuit has a transistor extending outwardly from a semiconductor substrate. The transistor has a first source/drain region, a body region, and a second source/drain region. The body region has opposing sidewall surfaces. And, the body region is formed of a fully depleted structure. A first gate is located on a first one of the opposing sidewall surfaces. A second gate is located on a second one of the opposing sidewall surfaces. Further, a local oscillator is coupled to the first gate, and a signal input is coupled to the second gate.

In another embodiment of the present invention, an analog circuit is provided. The analog circuit includes a dual-gated metal-oxide semiconducting field effect transistor (MOSFET) which extends outwardly from a semiconductor substrate. The dual-gated MOSFET has a first and a second source/drain region. The dual-gated MOSFET has a body region which includes opposing sidewall surfaces. The body region is formed of a fully depleted structure. A first gate is located on a first one of the opposing sidewall surfaces. A second gate located on a second one of the opposing sidewall surfaces. Further, a local oscillator can be coupled to the first gate to receive signals from a local oscillator signal and an analog signal input can be coupled to the second gate and provides an input signal to the second gate.

In another embodiment of the present invention, a signal processing integrated circuit is provided which includes both analog and digital circuits. The analog circuit includes a dual-gated metal-oxide semiconducting field effect transistor (MOSFET) which extends outwardly from a semiconductor substrate. The dual-gated MOSFET has a first and a second source/drain region. The dual-gated MOSFET has a body region which includes opposing sidewall surfaces. The body region is formed of a fully depleted structure. A first gate is located on a first one of the opposing sidewall surfaces. A second gate is located on a second one of the opposing sidewall surfaces. Further, a local oscillator can be coupled to the first gate to receive signals from a local oscillator signal and an analog signal input can be coupled to the second gate and provides an input signal to the second gate.

In another embodiment of the present invention, a communication device is provided. The communication device includes a signal processing circuit. The signal processing circuit has a dual-gated metal-oxide semiconducting field effect transistor (MOSFET) which extends second source/drain region. The dual-gated MOSFET has a body region which has opposing on a first one of the opposing sidewall surfaces. A second gate is located on a second one of the opposing sidewall surfaces. Further, a local oscillator is coupled to the first gate and provides a local oscillator signal to the first gate. A signal input is coupled to the second gate and provides an input signal to the second gate. The communication device also includes a receiver and a transmitter which are electrically coupled to the signal processing circuit for receiving and transmitting signals.

Yet another embodiment of the present invention includes a method of signal processing. The method includes biasing a first gate of a dual-gated MOSFET. The dual-gated MOSFET has a first and a second source/drain region. The dual-gated MOSFET has a body region which has opposing sidewall surfaces. The body region is formed from a fully depleted structure. The first gate opposes a first one of the opposing sidewall surfaces. A second gate of the dual-gated MOSFET is similarly biased. The second gate opposes a second one of the opposing sidewall surfaces. The method further includes a local oscillator signal to the first gate and applying an input signal to the second gate.

Thus, an improved structure and method are provided for signal processing. The structure includes a dual-gated metal-oxide semiconducting field effect transistor (MOSFET). The dual-gated MOSFET can be fabricated according to current CMOS processing techniques. The body region of the dual-gated MOSFET is a fully depleted structure. The structure includes two gates which are positioned on opposite sides of the opposing sides of the body region. Further, the structure operates as one device where the threshold voltage of one gate depends on the bias of the other gate. Thus, the structure yields a small signal component in analog circuit applications which depends on the product of the signals applied to the gates, and not simply one which depends on the sum of the two signals.

Figure 1A:
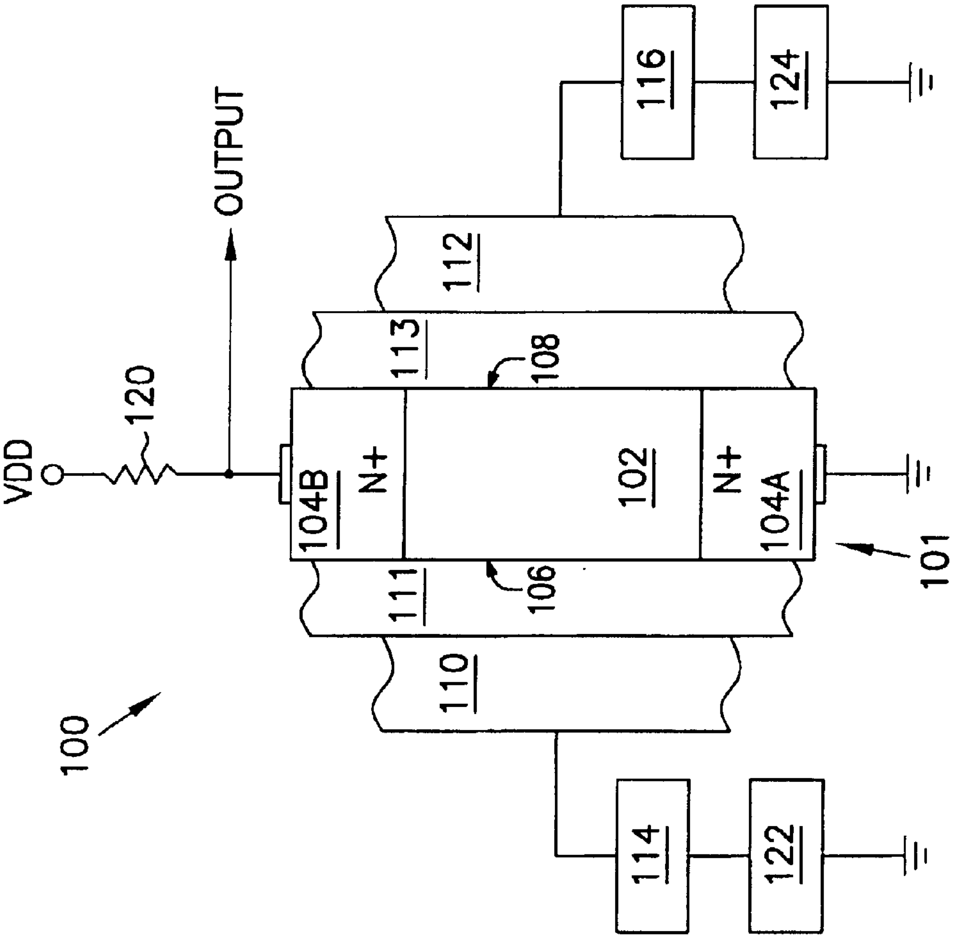
FIG. 1A is a diagram of an analog or RF circuit according to the teachings of the present invention.

FIG. 1A is a diagram of an analog or RF circuit 100 according to the teachings of the present invention. FIG. 1B is a block diagram illustrating the incorporation of the RF circuit 100 into a signal processing integrated circuit 50 according to the teachings of the present invention. The RF circuit 100 and digital integrated circuits are implemented on a single integrated circuit using, for example but not by way of limitation, a single complementary metal oxide semiconductor (CMOS) fabrication technique to form a signal processing integrated circuit 50. Those skilled in the art will readily recognize that other semiconductor fabrication techniques may be used to implement the present invention. Thus, signal processing integrated circuit 50 includes both analog and digital circuits on a single die or substrate.

The RF circuit 100 may include a mixer circuit, a frequency multiplier, a heterodyne receiver, or any equivalent analog circuit structure. The RF circuit 100 includes a dual-gated metal-oxide semiconducting field effect transistor (MOSFET) 101, or transistor 101. In one embodiment, the dual-gated MOSFET is a vertical MOSFET such as, for example, the vertical MOSFET shown and described in co-pending application Ser. No. 08/889,462, entitled "Memory Cell Having A Vertical Transistor with Buried Source/Drain And Dual Gates," filed on Jul. 8, 1997, now U.S. Pat. No. 6,150,687, which application is incorporated herein by reference. In an alternative embodiment, the dual-gated MOSFET is a lateral MOSFET such as, for example, the lateral MOSFET shown and described in co-pending application Ser. No. 09/050,281, entitled "Circuits and Methods for Dual-Gated Transistors," filed on Mar. 30, 1998, now U.S. Pat. No. 6,097,065, which application is incorporated herein by reference. The dual-gated MOSFET 101 extends outwardly from a substrate and includes a first and a second source/drain region, 104A and 104B respectively. The dual-gated MOSFET includes a body region 102 which has opposing sidewall surfaces, 106 and 108 respectively. The body region 102 is formed with appropriate doping concentrations and with an appropriately narrow width between the opposing sidewall surfaces, 106 and 108, such that body region can be fully depleted during MOSFET operation. A first gate 110 is located on, and opposes, a first one 106 of the opposing sidewall surfaces, 106 and 108 respectively. A second gate 112 is located on, and opposes, a second one 108 of the opposing sidewall surfaces, 106 and 108 respectively. The threshold voltage ($V_t$) of the first gate 110 is dependent on the potential applied to the second gate 112.

The first gate 110 is separated from the first one 106 of the opposing sidewall surfaces, 106 and 108, of the body region 102 by a thin oxide layer 111. The second gate 112 is separated from the second one 108 of the opposing sidewall surfaces, 106 and 108, of the body region 102 by another thin oxide layer 113. A local oscillator 114 is coupled to the first gate 110 and provides a local oscillator signal to the first gate 110. A signal input 116 is coupled to the second gate 112 and provides an input signal to the second gate 112. In one embodiment, the signal input 116 provides input signals having frequencies in the gigahertz (GHz) range to the second gate 112. In an alternate embodiment, the signal input 116 provides input signals having frequencies in the megahertz (MHZ) range to the second gate 112.

Additionally, as illustrated in FIG. 1A, a first dc source 122 is coupled to the first gate 110. Similarly, a second dc source 124 is coupled to the second gate 112. In one embodiment, the first dc source 122 and the second dc source 124 are distinct dc sources. In an alternative embodiment, the first dc source 122 and the second dc source 124 are a single source. In one embodiment, illustrated by FIG. 1B, the RF or analog circuit 100 is an integral component of, and coupled to, an integrated circuit chip 50 and that integrated circuit chip 50 is adapted to processing digital and analog signals. In a further embodiment, the integrated circuit chip 50 includes a complementary metal-oxide semiconductor (CMOS) chip upon which the RF or analog circuit 100 is fabricated.

Figure 2:
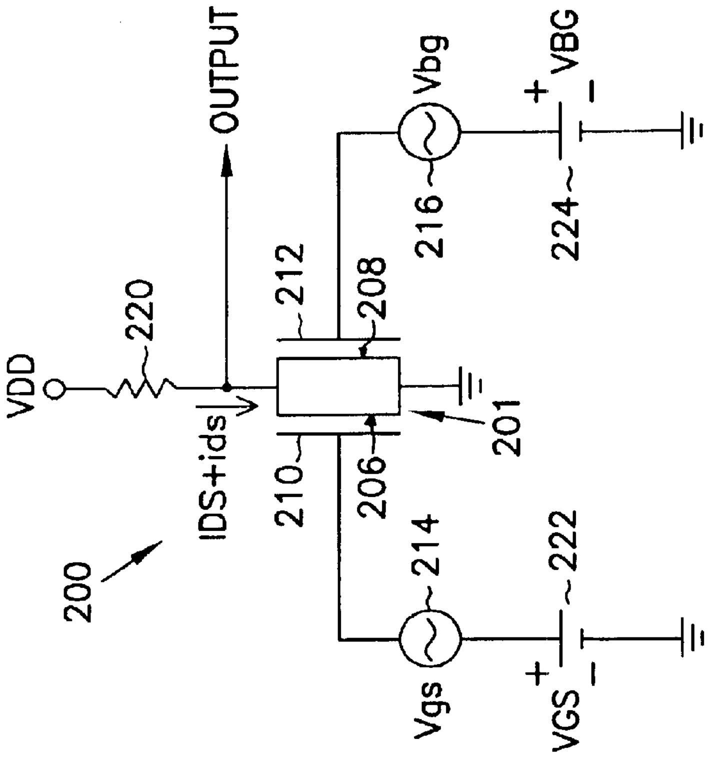
FIG. 2 is a schematic diagram illustrating an embodiment of the signal processing circuit of FIG. 1A.

FIG. 2 is a schematic diagram illustrating an embodiment 200 of the RF circuit 100 of FIG. 1A. The method of operation of the structural embodiment of FIG. 1A is described in connection with the schematic diagram of FIG. 2. FIG. 2 illustrates that the operation of the RF circuit 200 employs the use of a dual-gated MOSFET 201. The dual-gated MOSFET 201 includes the structure of the dual-gated MOSFET presented and described in connection with FIG. 1A. The dual-gated MOSFET 201 has a first gate 210 opposing a first one 206 of the dual-gated MOSFET's 201 opposing sidewall surfaces, 206 and 208 respectively. The dual-gated MOSFET 201 further includes a second gate 212 opposing a second one 208 of the dual-gated MOSFET's 201 opposing sidewall surfaces, 206 and 208.

The method of operation includes biasing the first gate 210 of the dual-gated MOSFET 201. In one embodiment, the first gate 210 is biased by a first dc voltage source 222. In an alternative embodiment, any other suitable biasing means may be employed. Further, the second gate 212 is similarly biased using a second dc voltage source 224. In one embodiment, biasing the second gate 212 includes biasing the second gate 212 prior to biasing the first gate 210. In an alternative embodiment, the first gate 210 and the second gate 212 are biased using a single biasing means. The threshold voltage ($V_t$) of the first, or front, gate 210 to source voltage, VGS, of this device is a function of the second, or back, gate 212 to source voltage, VBG. Alternatively stated, biasing the second gate 212 has the effect of shifting the threshold voltage ($V_t$) of the first gate 210. When the dual-gated MOSFET 201 is turned on, e.g., VGS greater than $V_t$, the dual-gated MOSFET 201 is biased sufficiently to position the operation of the dual-gated MOSFET 201 in the non-linear region of the transistor. The drain current of the dual-gated MOSFET, IDS, is a function of the capacitance of the gate oxides and the potentials VGS and VBG, at the front and back gates, 210 and 212 respectively. A local oscillator signal, Vgs, having a first frequency is applied by a local oscillator 214 to the first, or front, gate 210. An input signal, Vbg, having a second frequency is applied by a signal input 216 to the second, or back, gate 212. Superimposing, or applying, the local oscillator signal, Vgs, and the input signal, Vbg, upon the dc biases already applied to the first and second gates, 210 and 212 respectively, creates a small signal drain current, ids. The ids signal will include frequency terms, w1 and w2, representing the product of the two signals, Vgs and Vbg. This action achieves the multiplier or mixer action. Using a trigonometric identity the product term can be shown to be composed of signals at the difference of the frequencies, w2−w1, and the sum of the frequencies, w2+w1. Terms involving the square of the signals, $Vgs^2$ and $Vbg^2$ can be shown using another trigonometric identity to represent frequency doubling. Hence, the operation of the RF or analog circuit 200 can be used in a wide variety of signal processing functions.

In effect, the method of driving the first and second gates, 210 and 212, in the fashion set forth above results in the dual-gated MOSFET 201 outputting an intermediate frequency at the drain region, or the second source/drain region as described in connection with the structure of FIG. 1A. This intermediate frequency signal is then a combination of the collective signals provided to the first and second gates, 210 and 212 of the dual-gated MOSFET. Moreover, a number of different intermediate frequencies will be outputted from the dual-gated MOSFET 201 dependent upon the variation of the collective signals provided to the first and second gates, 210 and 212. The number of intermediate frequency signals output at the drain includes the product of the local oscillator signal and the input signal, the difference of the local oscillator signal and the input signal, and the sum of the local oscillator signal and the input signal. The method of configuring relevant circuitry to isolate these stated intermediate frequencies will be understood by one of ordinary skill in the art of signal processing upon reading of this specification.

Further, under an embodiment of operation in the present invention, applying an input signal to a second gate 212 includes applying an input signal having a frequency in the gigahertz (GHz) range. According to an alternative embodiment, applying an input signal to a second gate 212 includes applying an input signal having a frequency in the megahertz (MHZ) range.

Figure 3:
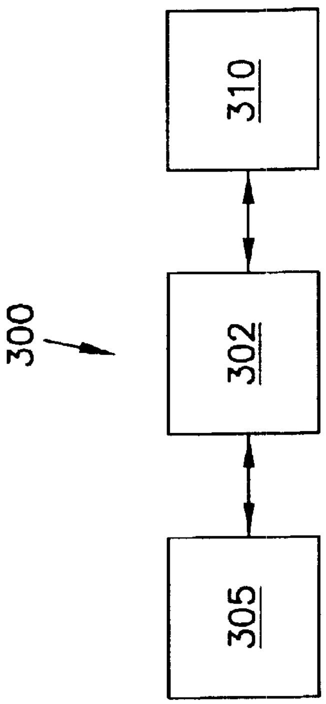
FIG. 3 is a block diagram illustrating a communication device according to an embodiment of the present invention.

FIG. 3 is a block diagram illustrating a communication device 300 according to an embodiment of the present invention. The communication device 300 includes the signal processing circuit 302 presented and described above in connection with FIGS. 1 and 2 as including signal processing integrated circuit 50 having an RF or analog portion 100 or 200. Further, the signal processing circuit 302 is electrically coupled to either a transmitter 305 or a receiver 310 or both and adapted to receiving and/or transmitting signals. The structure and method by which the transmitter 305 and the receiver 310 can be electrically coupled to the signal processing circuit 302 will be understood by one of ordinary skill in the art of signal processing upon reading of this specification. Accordingly, the detailed aspects of the transmitter 305 and the receiver 310 are not presented here.

Figure 4A:
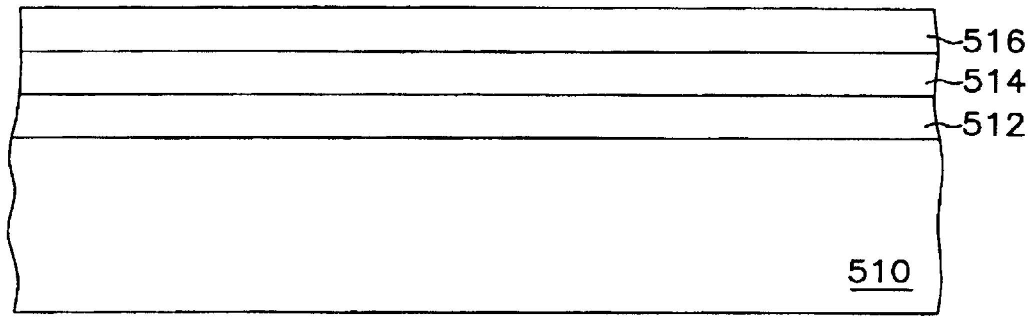
FIGS. 4A–4K illustrate an embodiment of a process of fabrication of a transistor according to the teachings of the present invention.

FIGS. 4A–4K illustrate an embodiment of a process of fabrication of a transistor according to the teachings of the present invention. In the embodiment of FIG. 4A, a p- bulk silicon substrate 510 starting material is used. An n++ and n+ silicon composite first source/drain layer 512 is formed on substrate 510, such as by ion-implantation, epitaxial growth, or a combination of such techniques. The overall thickness of the first source/drain layer 512 can be approximately between 0.2 to 0.5 μm. A body region layer 514 of p- silicon is formed, such as by vertical epitaxial growth, to a thickness that can be about 0.4 μm. A second source/drain region layer 516 of n+ silicon is formed, such as by ion-implantation into body region layer 514 or by epitaxial growth on body region layer 514, to a thickness that can be approximately between 0.2 and 0.5 μm.

In an alternative embodiment the approximate thicknesses provided above for the first source/drain region layer 512, the body region layer 514, and the second source/drain region layer 516 can be proportionally scaled down to provide a sub-micron device which has a body region layer 514 thickness of less than 0.5 μm.

Figure 4B:
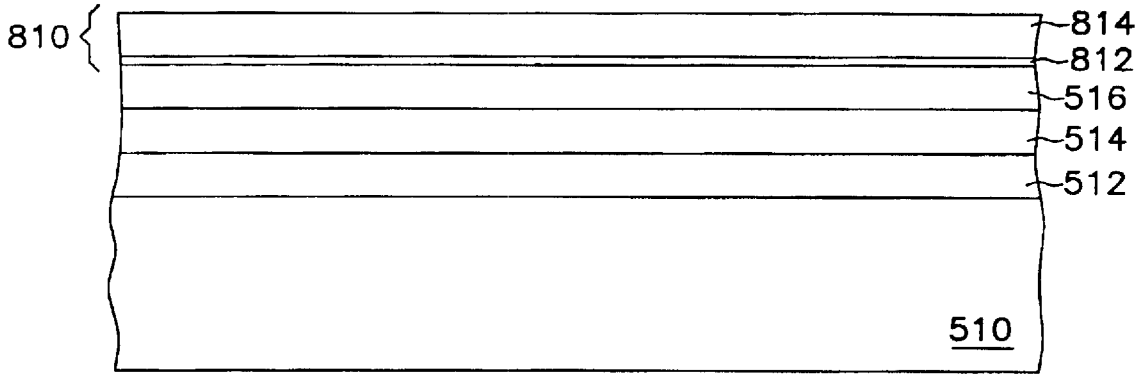

In FIG. 4B, a silicon dioxide ($SiO_2$) thin pad oxide layer 812 is formed on second source/drain region 516, such as by chemical vapor deposition (CVD). In one embodiment, pad oxide layer 812 can be approximately 10 nm in thickness. A thin silicon nitride ($Si_3N_4$) layer 814 is formed on pad oxide layer 812, such as by CVD. In one embodiment, nitride layer 814 can be approximately 100 nm in thickness.

Figure 4C:
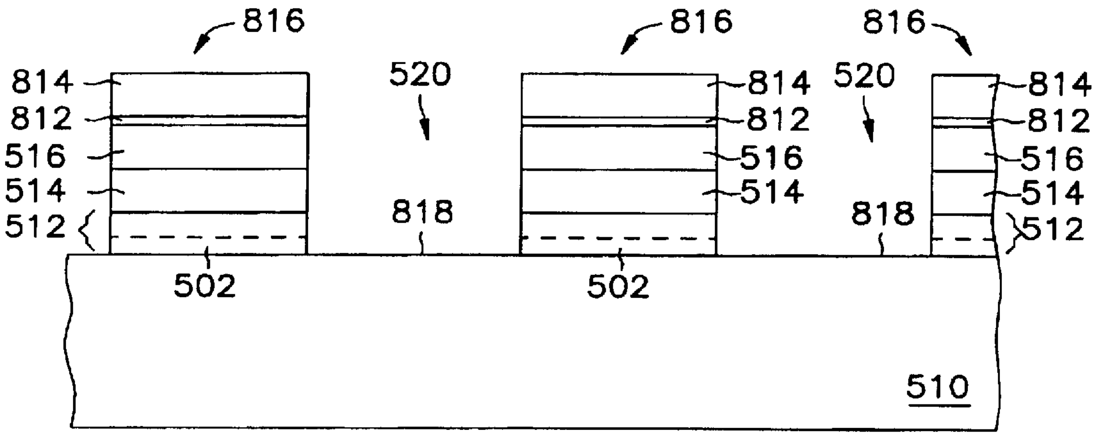

In FIG. 4C, photoresist is applied and selectively exposed to provide a mask for the directional etching of trenches 520, such as by reactive ion etching (RIE). The directional etching results in a plurality of column bars 816 containing the stack of nitride layer 814, pad oxide layer 812, second source/drain layer 516, body region layer 514, and first source/drain layer 512. Trenches 520 are etched to a depth that is sufficient to reach the surface 818 of substrate 510, thereby providing separation between what can serve as conductively doped bit lines 502 beneath the first source/drain region layer 512. Bars 816 are oriented in the direction of bit lines 502. In an exemplary embodiment, bars 816 have a surface line width which is sufficiently thin, vis-a-vis the doping concentration of the body region 514, such that the bulk charge is extremely small, negligible in device operation, and the body region 514 can be fully depleted when a gate potential is applied. The depth and width of each trench 520 can be approximately equal to the line width of bars 816.

Figure 4D:
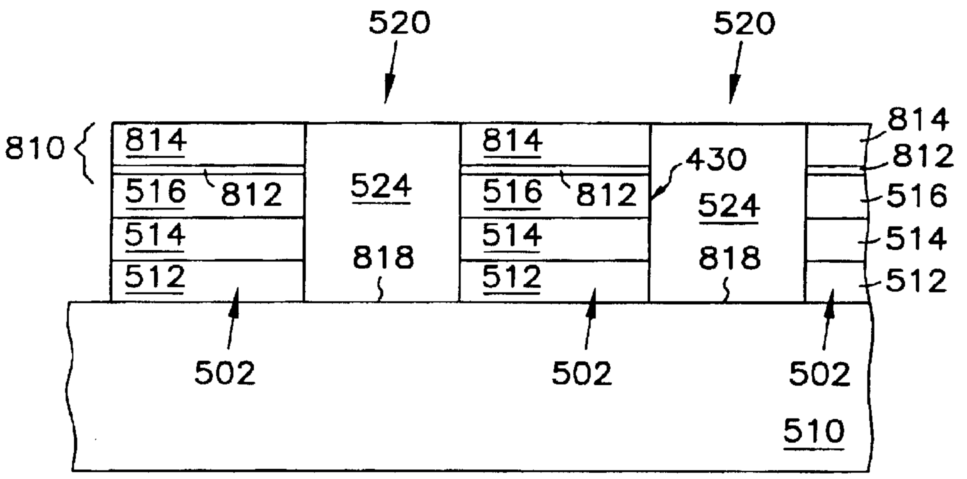

In FIG. 4D, the photoresist is removed. Isolation material 524, such as $SiO_2$ is deposited to fill the trenches 520. The working surface is then planarized, such as by chemical mechanical polishing/planarization (CMP).

Figure 4E:
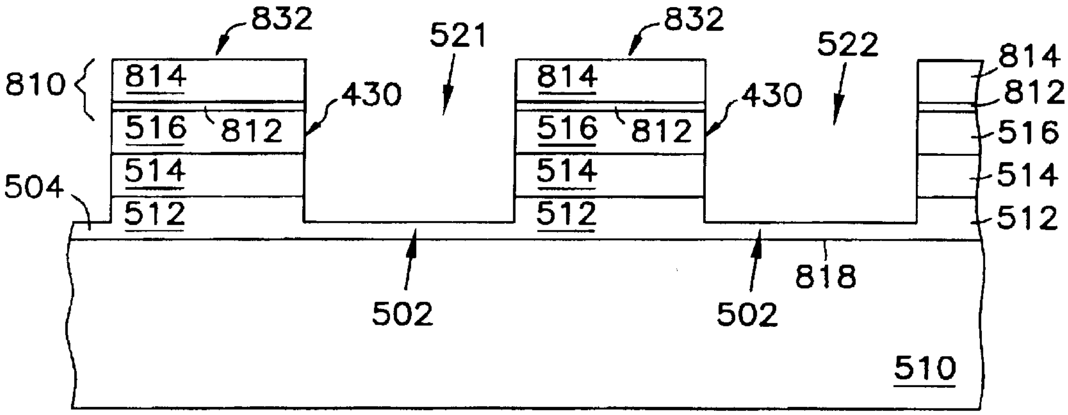

FIG. 4E illustrates the view of FIG. 1D after clockwise rotation by ninety degrees. In FIG. 4E, a photoresist material is applied and selectively exposed to provide a mask for the directional etching of trenches 521 and 522, such as by reactive ion etching (RIE) of a plurality of row bars 832 that are disposed orthogonally to bit lines 502. Forming trenches 521 and 522 includes etching though stacked layers in the portions of bars 816. Forming trenches 521 and 522 also includes etching through the isolation material 524 disposed between bars 816.

More particularly, trenches 521 and 522 are etched through nitride layer 814, pad oxide layer 812, second source/drain layer 516, body region layer 514, and partially into first source/drain layer 512. Trenches 521 and 522 are etched into bars 816 to a sufficient depth into first source/drain layer 512 such that the underlying bit line 502 portion of the first source/drain layer 512 is left intact. Trenches 521 and 522 are also etched into the isolation material 524 between bars 816. In one embodiment, after etching nitride layer 814 of bars 816, a nonselective dry etch is used to remove the isolation material 524 between bars 816 and also the pad oxide layer 812, second source/drain layer 516, body region layer 514, and a portion of first source/drain layer 512 of bars 816. The directional etching of trenches 521 and 522 results in the formation of a plurality of row bars 832 that are orthogonal to column bars 816.

Figure 4F:
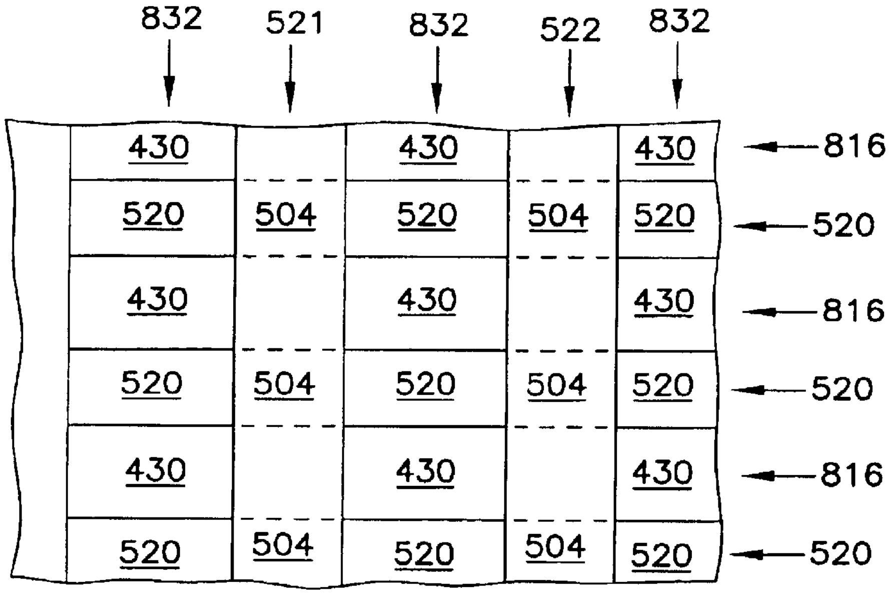

FIG. 4F is a plan view illustrating generally the arrangement of parallel bars 816, and trenches 520 interposed therebetween. Bars 832 are arranged orthogonally to bars 816. Trenches 521 and 522 are interposed between ones of bars 832. The resulting semiconductor pillars in the intersecting portions of bars 832 and 816 provide first and second source/drain regions 512 and 516, respectively, and body region 514 for metal-oxide semiconductor field effect transistor (MOSFET) formation.

Figure 4G:
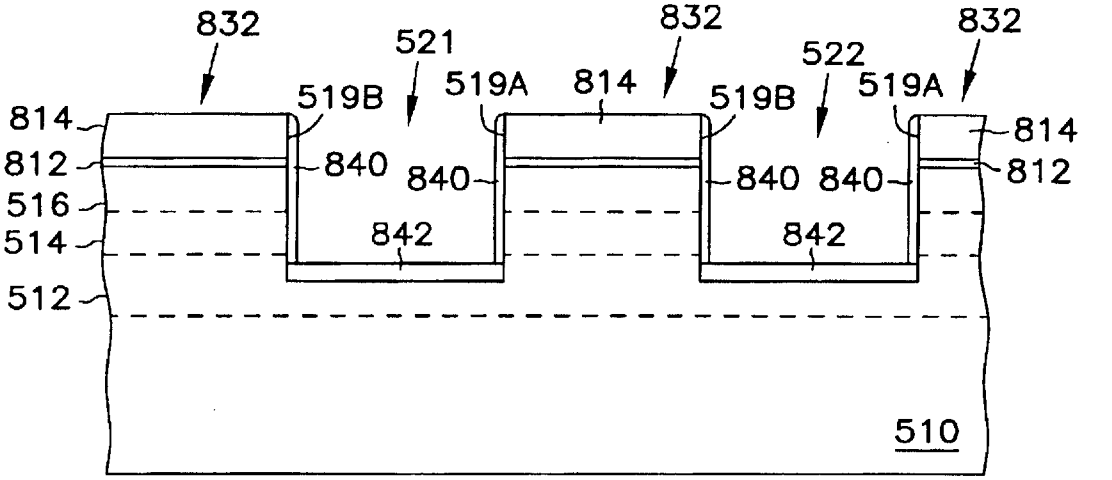

In FIG. 4G, which is oriented similarly to FIG. 4E, a conformal silicon nitride layer 840 is formed, such as by CVD. Nitride layer 840 is directionally etched, such as by RIE, to leave resulting portions of nitride layer 840 only on the first and second opposing sidewalls, 519A and 519B, of the bars 832 in trenches 521 and 522. In one embodiment, the thickness of nitride layer 840 is about 20 nm. An oxide layer 842 is formed, such as by thermal growth, at the base portions of trenches 521 and 522. Oxide layer 842 insulates the underlying bit lines 502 from structures subsequently formed in trenches 521 and 522. After forming oxide layer 842, remaining portions of nitride layer 840 are removed.

Figure 4H:
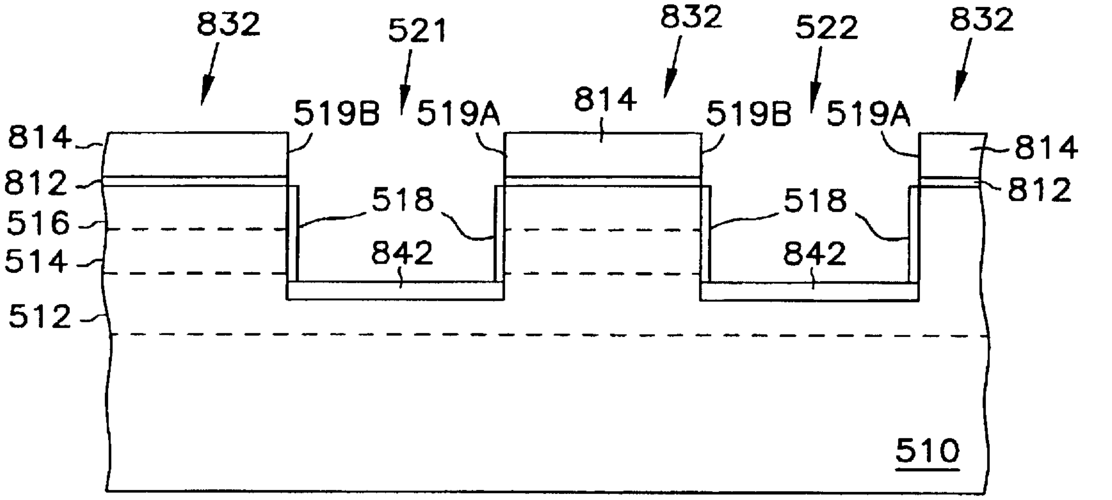
Figure 4I:
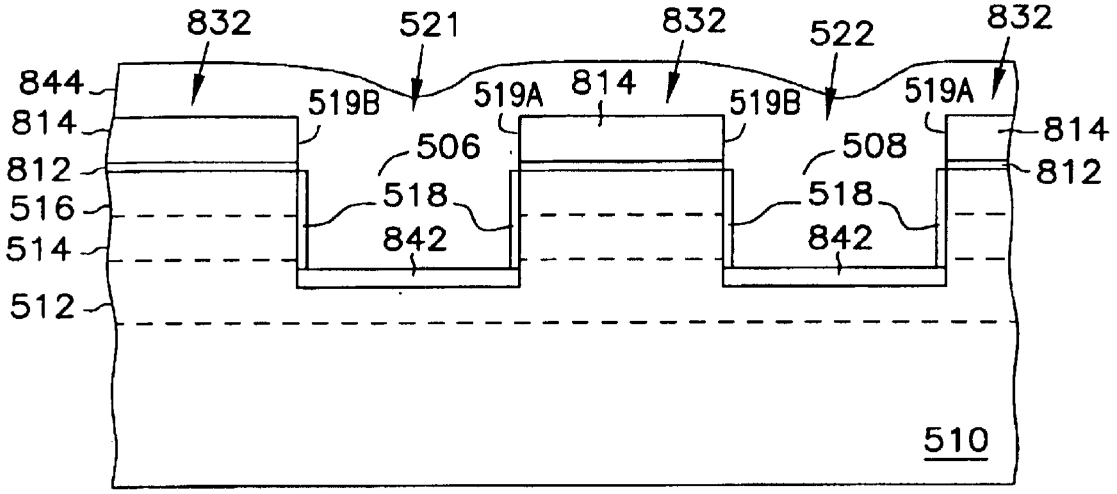

In FIG. 4H, a gate oxide 518 is formed on the first and second opposing sidewalls, 519A and 519B, in trenches 521 and 522 of second source/drain region 516, body region 514, and first source/drain region 512. In one embodiment, gate oxide 518 is a high-quality thin oxide layer that is thermally grown on the first and second opposing sidewalls, 519A and 519B, of trenches 521 and 522. In FIG. 4I, a conductive layer 844 is formed over the working surface of the wafer, including filling trenches 521 and 522 in which respective first and second word lines 506 and 508 will be formed. The first and second word lines 506 and 508 will serve as first and second gates, 506 and 508, opposing the first and second opposing sidewalls, 519A and 519B, of trenches 521 and 522. In one embodiment, layer 844 is formed by CVD of a refractory metal, such as tungsten. In another embodiment, layer 844 is formed by CVD of n+ polysilicon.

Figure 4J:
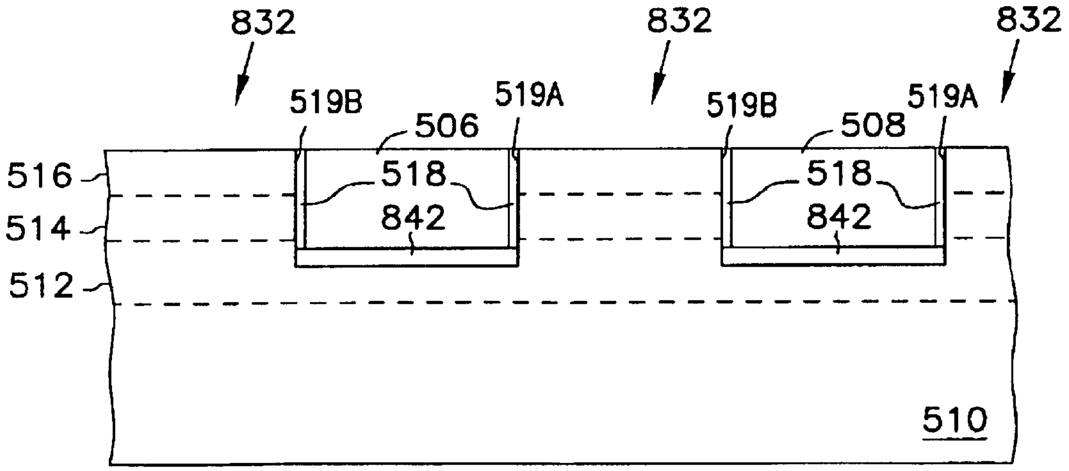

In FIG. 4J, CMP or other suitable planarization process is used to remove portions of layer 844 above the interface between pad oxide 812 and second source/drain layer 516. Pad oxide 812 and nitride layer 814 are also removed during this planarization step. As a result of the planarization step, first and second word lines 506 and 508, which serve as first and second gates, 506 and 508, opposing the first and second opposing sidewalls, 519A and 519B, are formed in trenches 521 and 522.

Figure 4K:
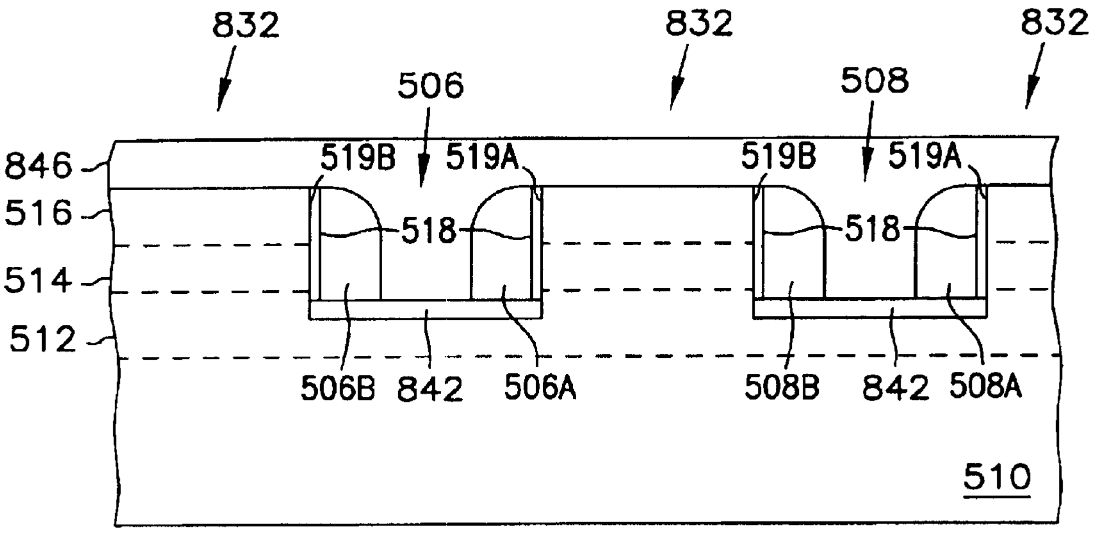

In FIG. 4K, the first and second gates, 506 and 508, opposing the first and second opposing sidewalls, 519A and 519B are directionally etched, thereby leaving resulting separate gates 506A, 506B and 508A, 508B. In one embodiment, separate gates 506A and 508B serve as a first gate 506A and second gate 508B opposing the first and second opposing sidewalls, 519A and 519B, in trenches 521 and 522. Splitting the first and second gates, 506 and 508, respectively, provides the resulting structure illustrated in FIG. 7, but is not required to practice the invention. In one embodiment, an insulating layer 846, such as $SiO_2$, is formed on the working surface of the wafer, such as by CVD. The structure thus formed may undergo further processing steps to complete integrated circuits on the working surface of the wafer using known techniques and followed by conventional back end of line (BEOL) procedures.

Figure 5A:
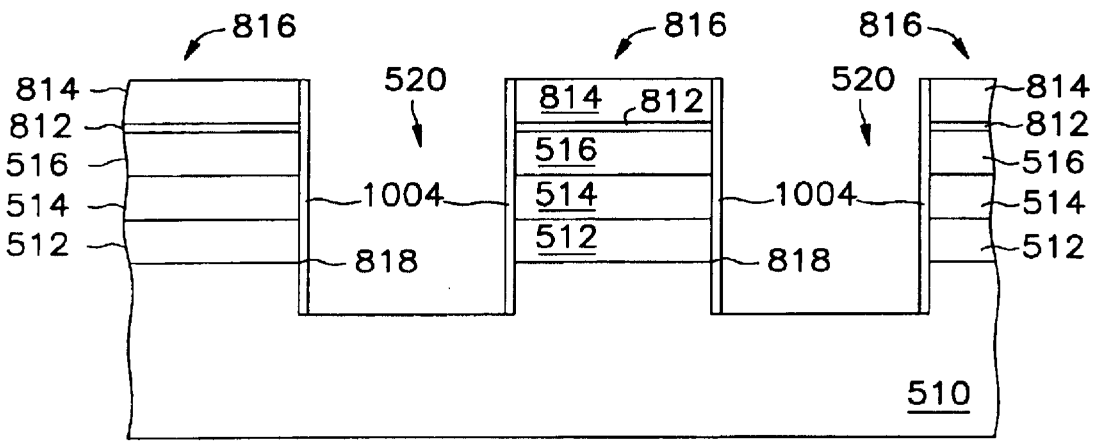
FIGS. 5A–5C illustrate an additional embodiment of the process of fabrication taught in connection with FIGS. 4A–4K.
Figure 5B:
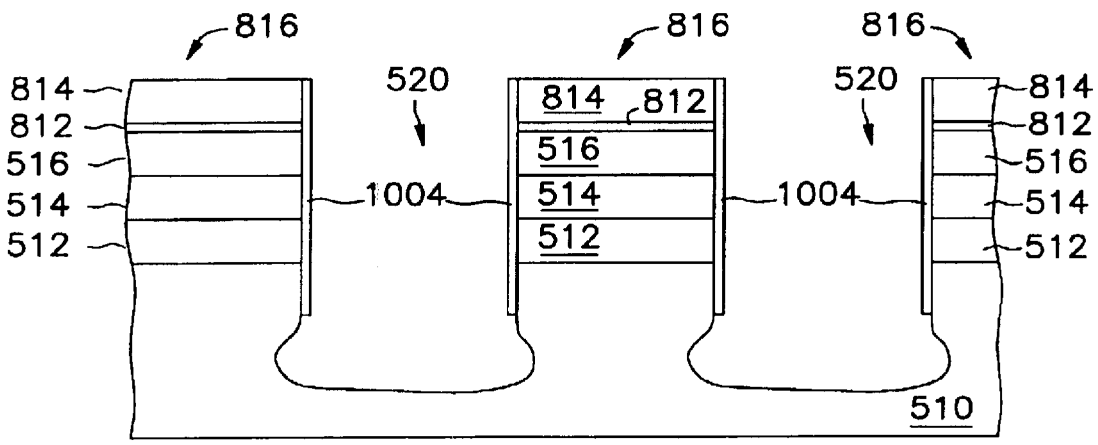
Figure 5C:
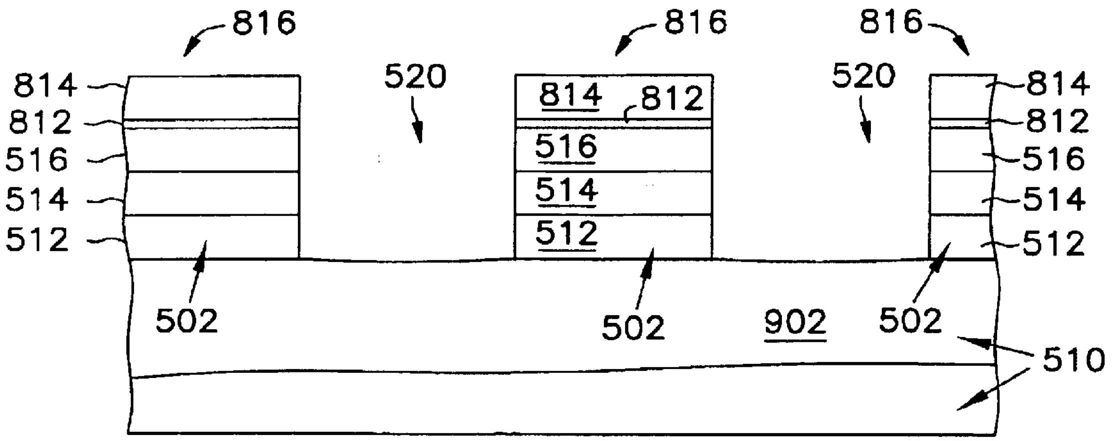

FIGS. 5A–5C illustrate generally, by way of example, additional steps used to form SOI bars during the fabrication steps described above with respect to FIGS. 4A–4K, such that the MOSFET formed, extends vertically outward from an insulating portion 902 of substrate 510.

In FIG. 5A, the processing steps described above with respect to FIGS. 4A–4C are carried out, forming trenches 520 that are etched to a depth that is below the original surface 818 of substrate 510, such as by approximately greater than or equal to 0.6 μm. A nitride layer 1004 is formed, such as by CVD. Nitride layer 1004 is directionally etched, such as by RIE, to remove nitride layer 704 from the base regions of trenches 520. Portions of nitride layer 1004 remain on the sidewall of trenches 520 to protect adjacent layers during subsequent etching and oxidation.

In FIG. 5B, an isotropic chemical etch of silicon is used to partially undercut bars 816. For example, hydrofluoric acid (HF) or a commercial etchant sold under the trade name CP4 (a mixture of approximately 1 part (46% HF): 1 part ($CH_3COOH$):3 parts ($HNO_3$)) can be used for the isotropic etchant. In one embodiment, the partial undercutting of bars 816 by isotropic etching is timed to remove a volume of silicon that is sufficient to compensate for a subsequently formed volume of oxide, described below. In general, the subsequent oxidation step produces a volume of oxide that is approximately twice that of the silicon consumed during oxidation.

In FIG. 5C, substrate 510 is oxidized using a standard semiconductor processing furnace at a temperature of approximately 900 to 1,100 degrees Celsius. A wet oxidizing ambient is used in the furnace chamber to oxidize the exposed silicon regions in the lower portion of trenches 520. Substrate 510 is oxidized for a time period that is sufficient to form oxide insulating portion 902 that fully undercuts bars 816. Insulating portion 902 underlies both bars 816 and trenches 520, and isolates the bit lines 502 and MOSFETs formed on bit lines 502 from an underlying semiconductor portion of substrate 510. Nitride layer 1004 is removed, and processing then continues as described above with respect to FIGS. 4D–4K.

In one embodiment, bars 816 are sufficiently narrow such that the oxidation step that undercuts bars 816 produces sufficient oxide to fill trenches 520, resulting in a generally planar structure. This avoids the need for a separate step of depositing an oxide insulation material 524 described with respect to FIG. 4D. The oxidation time period depends on the width of bars 816 and the effective width of bars 816 after the undercut etch step. Narrower bars 816 require shorter oxidation times. For example, for sub-0.25 micron technology, oxidation time is approximately 1 hour. In another embodiment, the etch step fully undercuts bars 816 before oxidation. This further reduces oxidation time.

Figure 6A:
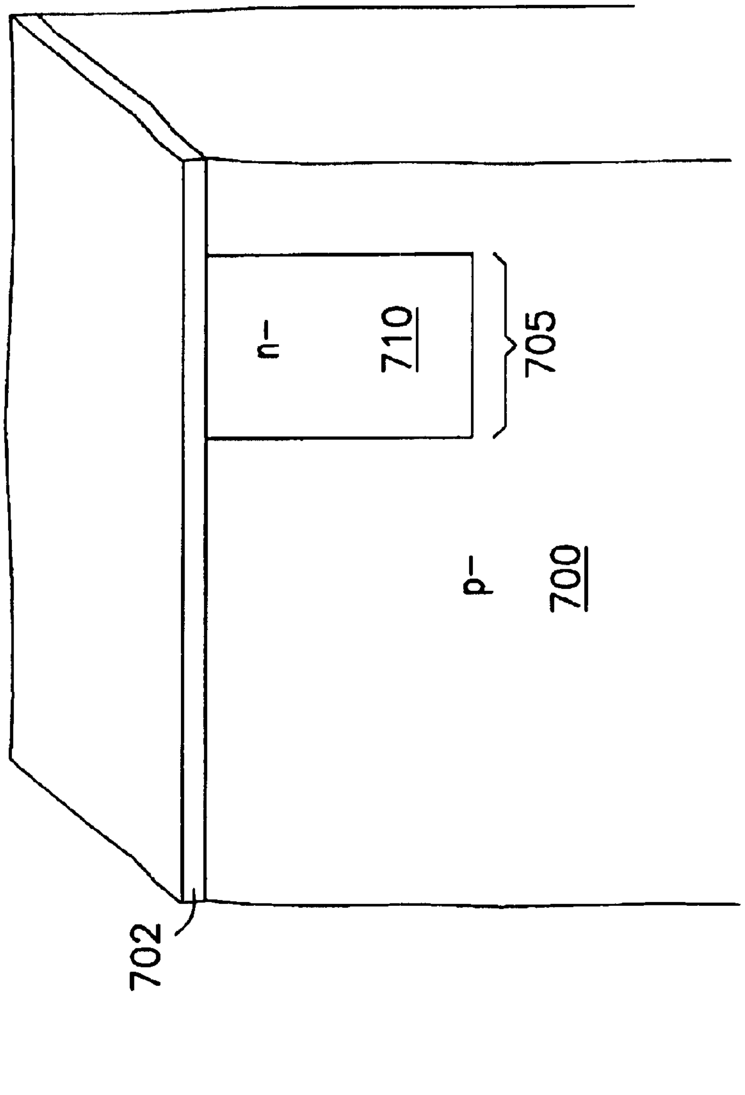
FIGS. 6A–6O illustrate an embodiment of a process of fabrication of a complementary pair of transistors according to the teachings of the present invention.

FIGS. 6A–6O illustrate an embodiment of a process of fabrication of a complementary pair of transistors according to the teachings of the present invention. FIG. 6A begins with a lightly doped p- silicon substrate 700. A thin screen oxide layer 702 is thermally grown. The oxide layer 702 is formed to a thickness of approximately 10 nanometers (nm). A photoresist is applied and selectively exposed to reveal p-channel metal-oxide semiconductor (PMOS) device regions 705. Wells of n-type silicon material are formed in the substrate 700 to form the PMOS device regions 705. The n-wells 710 of n-type material can be formed by any suitable method, such as by ion implantation. The n-wells 710 are formed to a depth of approximately 1.0 micrometer (μm). The photoresist is removed using conventional photoresist stripping techniques. The structure is then annealed, such as by a rapid thermal anneal (RTA) process, to achieve the desired doping profile. The structure is now as it appears in FIG. 6A.

Figure 6B:
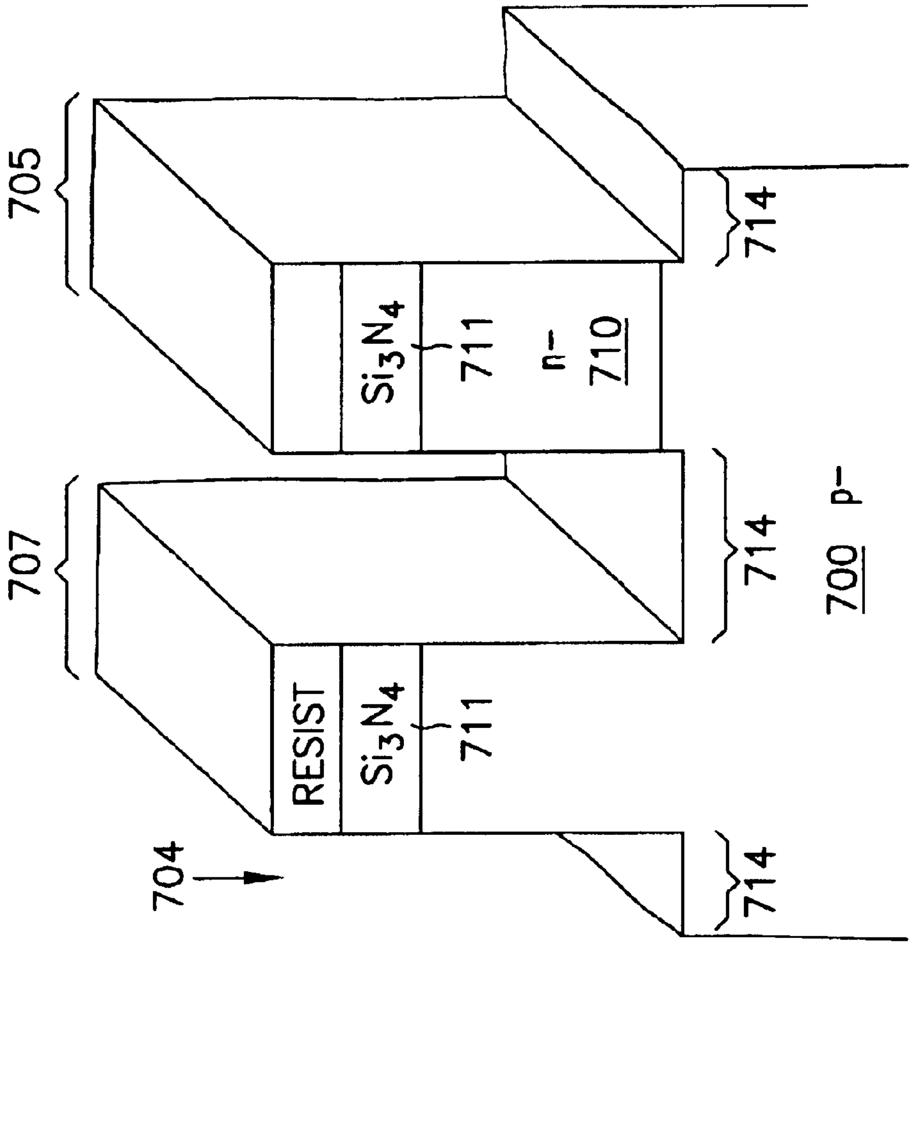

FIG. 6B illustrates the structure after the next sequence of processing steps. A silicon nitride ($Si_3N_4$) pad layer 711 is deposited on the upper surface 704 of the substrate 700 and the n-wells 710. The nitride layer 711 is formed by any suitable means, such as by chemical vapor deposition (CVD). The nitride layer 711 is formed to a thickness of approximately 0.4 μm. A photoresist is applied and selectively exposed to mask stripes which define active device regions, including both n-channel metal-oxide semiconductor (NMOS) device regions 707 and PMOS device regions 705. In an exemplary embodiment, the active device regions, including both n-channel metal-oxide semiconductor (NMOS) device regions 707 and PMOS device regions 705 are defined to have a width which is sufficiently thin, vis-a-vis the doping concentration of the body region 514, such that the bulk charge in the active device regions is extremely small, negligible in device operation. This is to facilitate that the active device regions, including both n-channel metal-oxide semiconductor (NMOS) device regions 707 and PMOS device regions 705 can be fully depleted when a gate potential is applied. The nitride layer 711 in between device regions, 705 and 707, is removed. The nitride layer 711 is removed by any suitable etching technique, such as by RIE. The exposed n-well material 710 and p- substrate material 700 is etched to a depth of approximately 0.2 $\mu$m below the bottom of the n-well 710/substrate 700 interface. These etching steps leave trenches 714 between the device regions 707 and 705. The etching is performed though any suitable process, such as by RIE. The structure is now as shown in FIG. 6B. The photoresist is next stripped, using conventional photoresist stripping techniques.

Figure 6C:
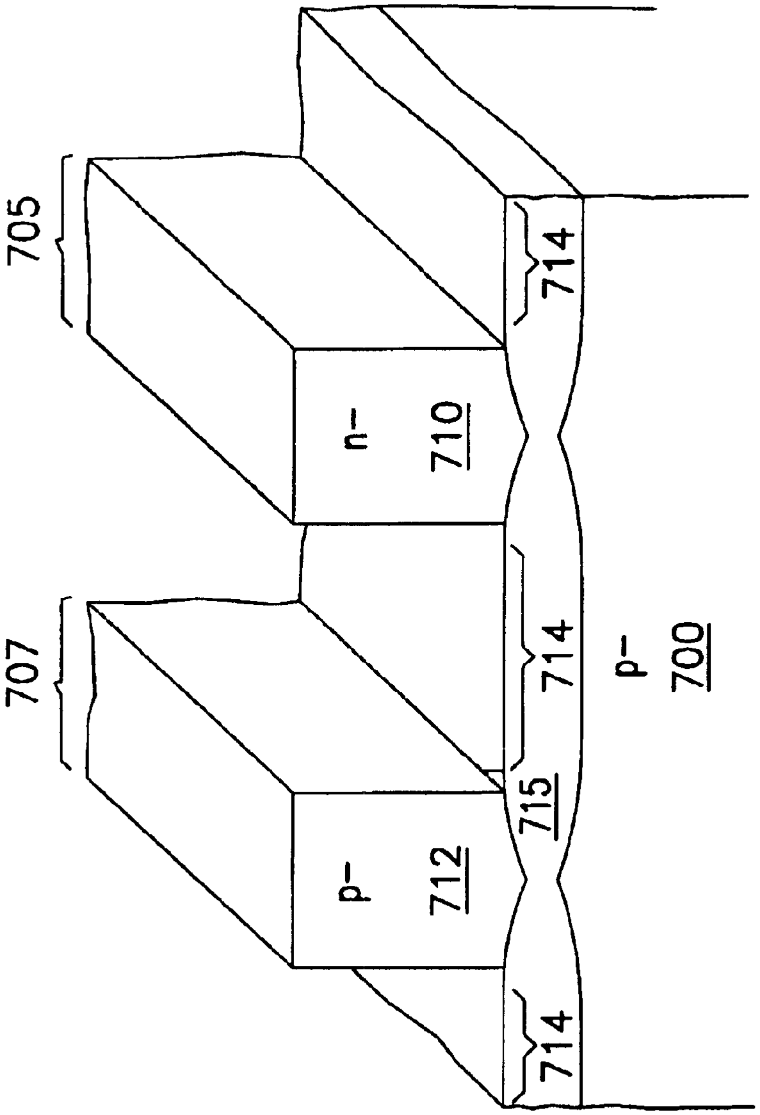

FIG. 6C illustrates the structure after the next series of processing steps. An insulator layer 715 is formed beneath the device regions, 705 and 707 respectively, so as to form a semiconductor on insulator (SOI) structure. The insulator layer 715 is formed using, for example, the techniques of U.S. application Ser. No. 08/745,708, entitled Silicon-On-Insulator Islands and Method for Their Formation (the '708 Application), or U.S. Pat. No. 5,691,230, entitled Technique for Producing Small Islands of Silicon on Insulator (the '230 Patent). The '708 Application and the '230 Patent are incorporated by reference. The insulator layer 715 separates from substrate 700 the p− single crystalline silicon structure 712 of the NMOS device region 707, and the single crystalline silicon structure n-well 710 of the PMOS device region 705. Any of the nitride layer 711 left on the device regions, 705 and 707, is removed by etching. Any suitable etching technique may be used. In one embodiment, the nitride layer is removed by reactive ion etching (RIE). In an alternative embodiment, the nitride layer is removed using a wet etch process. The structure is now as illustrated in FIG. 6C.

Figure 6D:
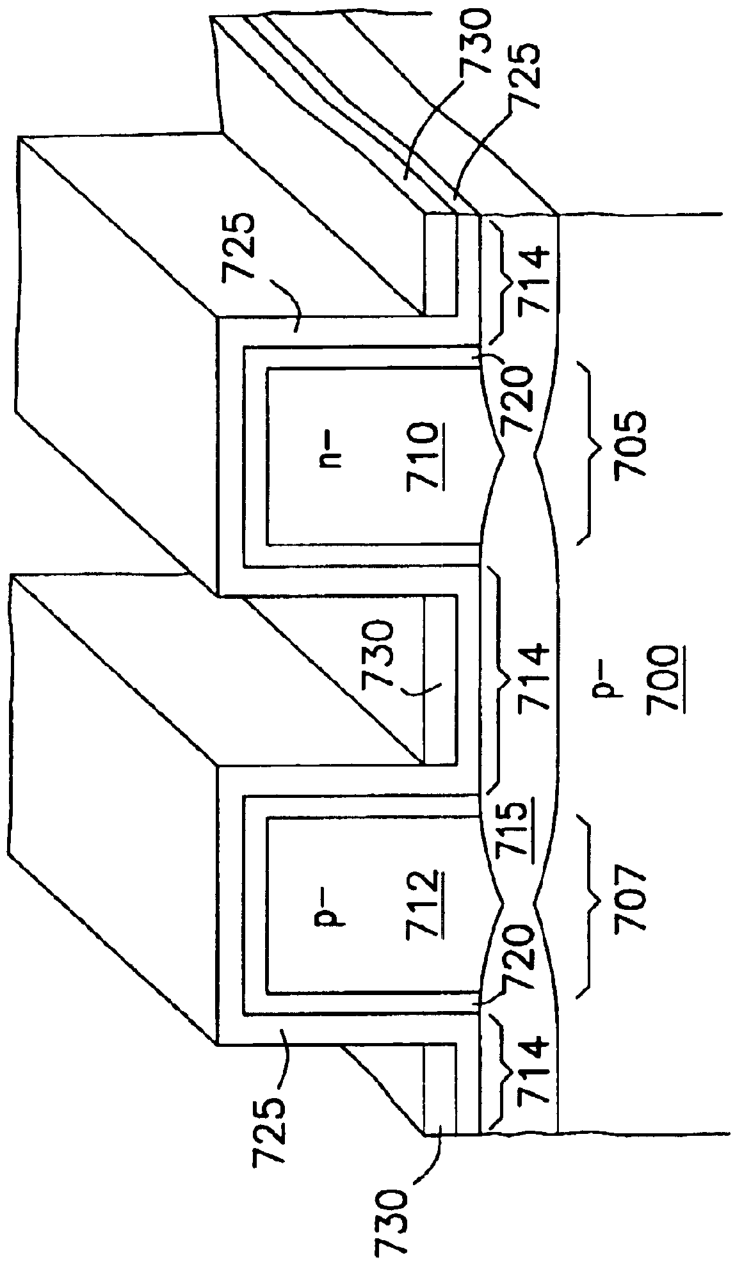

FIG. 6D illustrates the structure following the next series of processing steps. A thin oxide layer 720 is thermally grown on active device regions, 705 and 707. The oxide layer 720 is grown to a thickness of approximately 20 nanometers (nm). A thin silicon nitride ($Si_3N_4$) layer 725 is deposited over the entire surface by CVD. The nitride layer 725 is deposited to a thickness of approximately 50 nm. Intrinsic polysilicon 730 is deposited by any suitable methods, such as by CVD, to fill the trenches 714. Next, the intrinsic polysilicon 730 over the structure is planarized stopping on the nitride pads 725. The intrinsic polysilicon 730 can be planarized by any suitable process, such as by chemical mechanical polishing/planarization (CMP). The intrinsic polysilicon 730 in the trenches 714 is selectively etched back further, such as by RIE, to leave only a thin layer on the bottom of trenches 714. The structure is now as is shown in FIG. 6D.

Figure 6E:
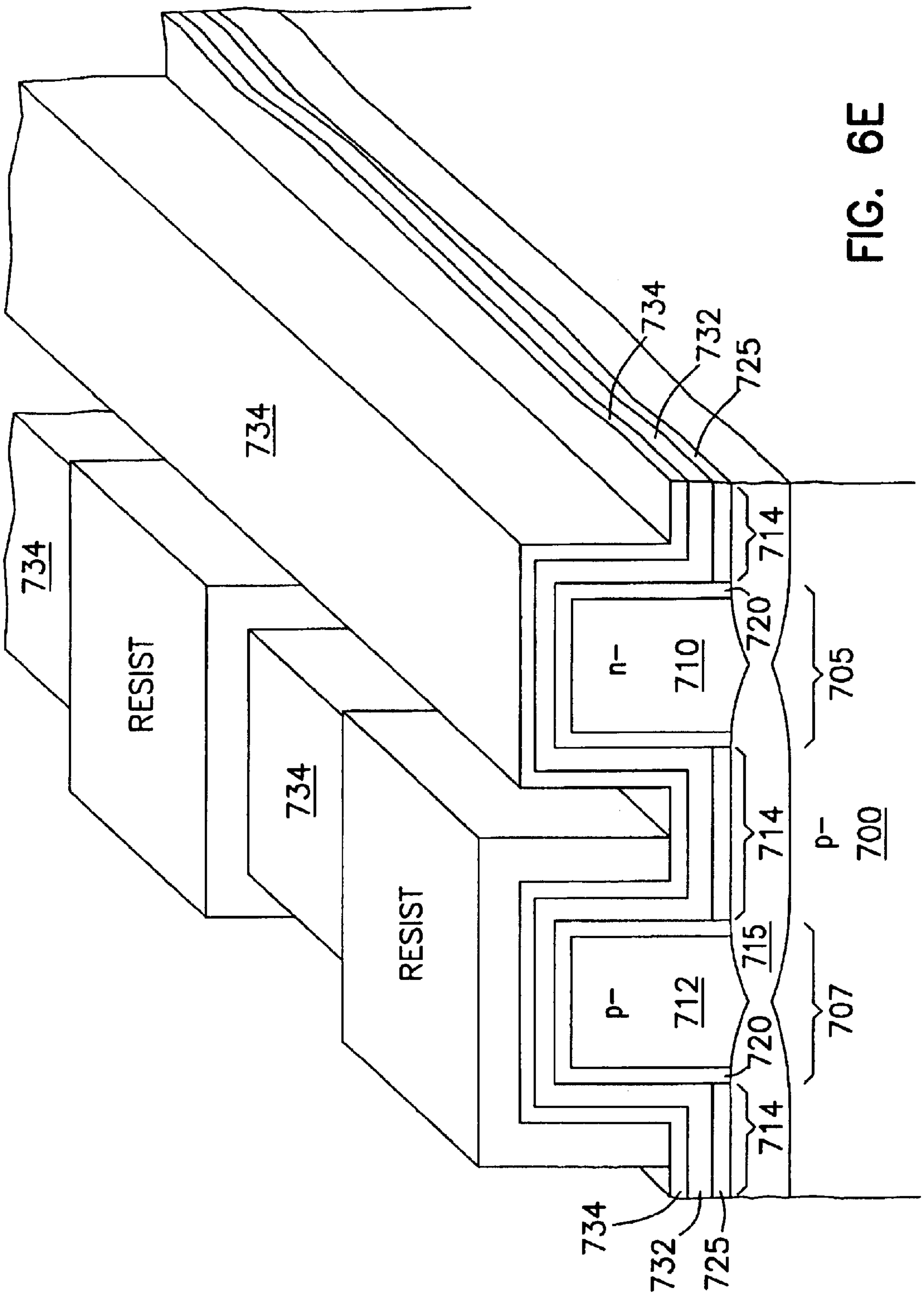

FIG. 6E shows the structure following the next sequence of processing steps. Every exposed portion of the nitride layer 725 is removed by a selective wet etch or RIE, leaving only the nitride 725 covered by the intrinsic polysilicon 730 at the bottom of the trenches 714. The intrinsic polysilicon 730 is then removed by a selective wet etch or RIE. The device regions, 705 and 707 respectively, remain protected by the oxide layer 720. Next, n-doped glass 732 is deposited, such as by CVD. In one embodiment the n-doped glass 732 is Arsenic silicate glass (ASG). In another embodiment, the n-doped glass 732 is Phosphorus silicate glass (PSG). The n-doped glass 732 is deposited to a thickness of approximately 100 nm. A new silicon nitride ($Si_3N_4$) layer 734 is deposited over the n-doped glass 732. The new nitride layer 734 is CVD deposited to a thickness of approximately 20 nm. A photoresist is applied and selectively exposed to reveal PMOS device regions 705 and to pattern the n-doped glass 732 in the NMOS device regions 707 in the form of future first and second source/drain regions. The structure is now as is shown in FIG. 6E.

Figure 6F:
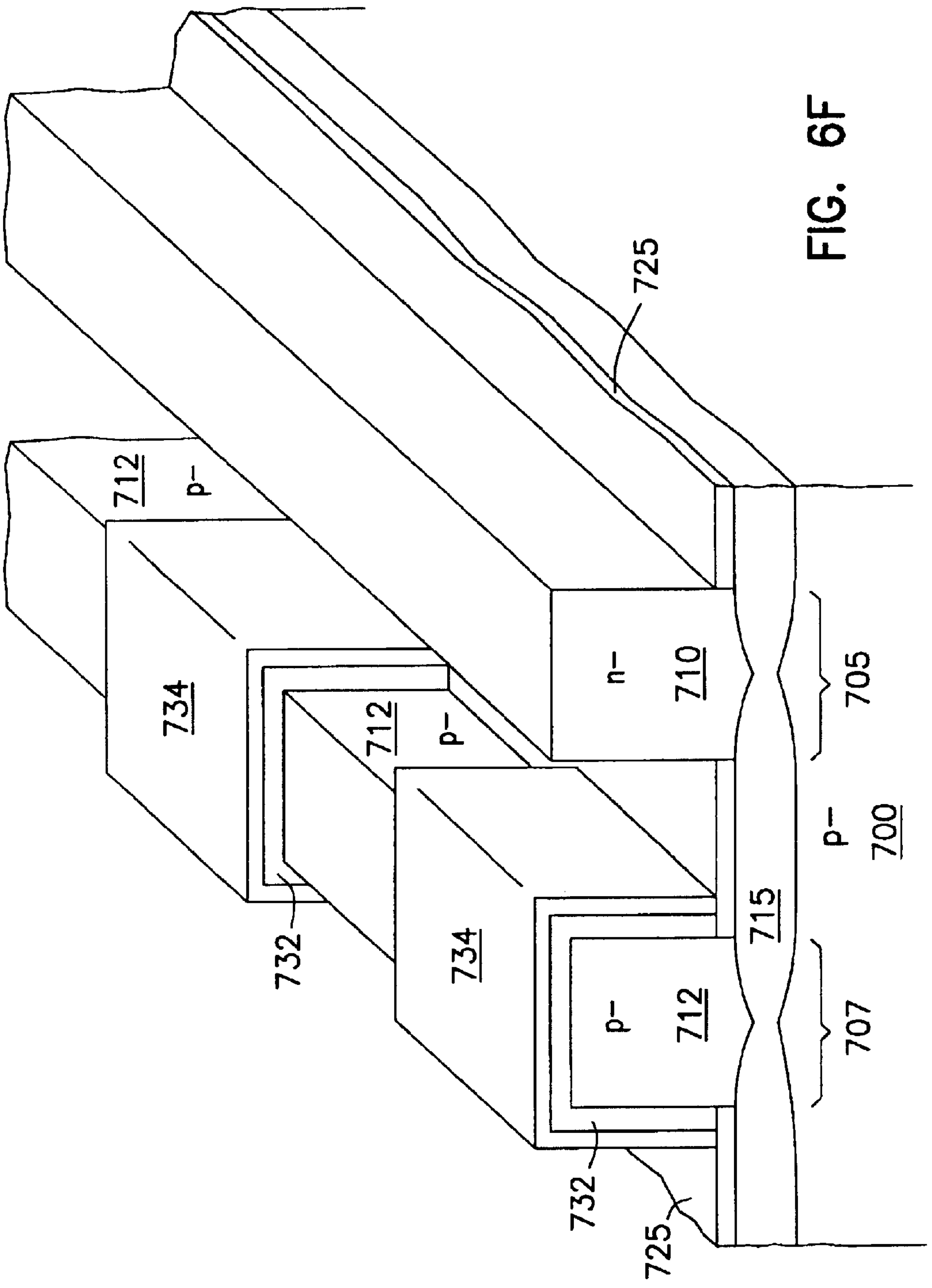

FIG. 6F illustrates the structure following the next series of process steps. The exposed nitride 734 and the underlying n-doped glass 732 are removed by any suitable means, such as by RIE. The nitride located at the bottom of the trenches 714 serves as an etch stop and protects the underlying insulator layer 715. The photoresist is stripped using conventional stripping techniques. A thin nitride layer 734 remains on the patterned n-doped glass 732 which was shielded by the photoresist. The structure is now as is shown in FIG. 6F.

Figure 6G:
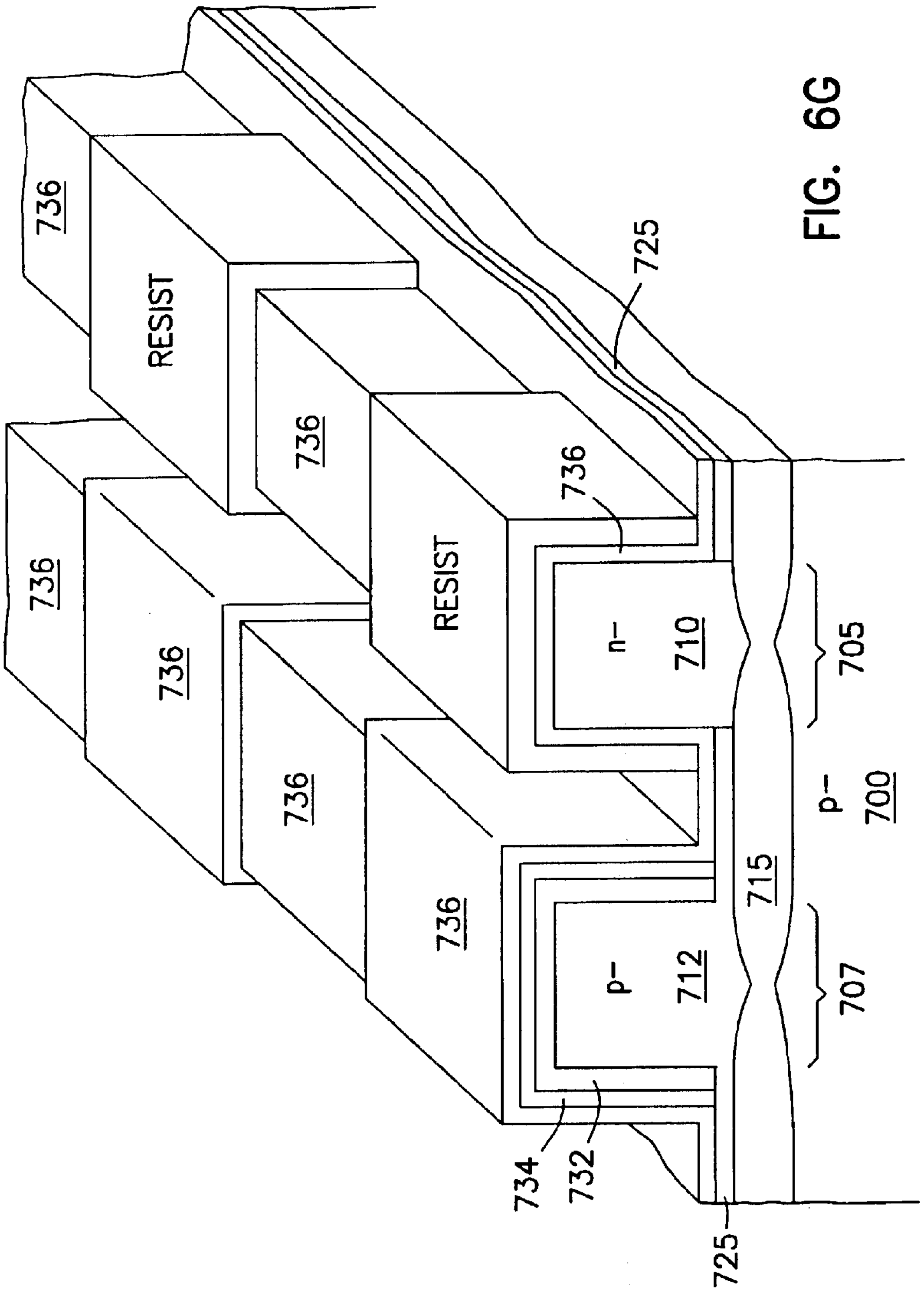

FIG. 6G illustrates the structure following the next sequence of steps. A p-doped glass 736 is deposited by any suitable means such as, for example, CVD. In one embodiment, the p-doped glass 736 is borosilicate glass (BSG). The p-doped glass 736 is deposited to a thickness of approximately 100 nm. Again, a photoresist is applied and exposed to now reveal the NMOS device regions 707 and to pattern the p-doped glass 736 in the PMOS device regions 705 in the form of future first and second source/drain regions. The structure is now as is shown in Figure 6G.

Figure 6H:
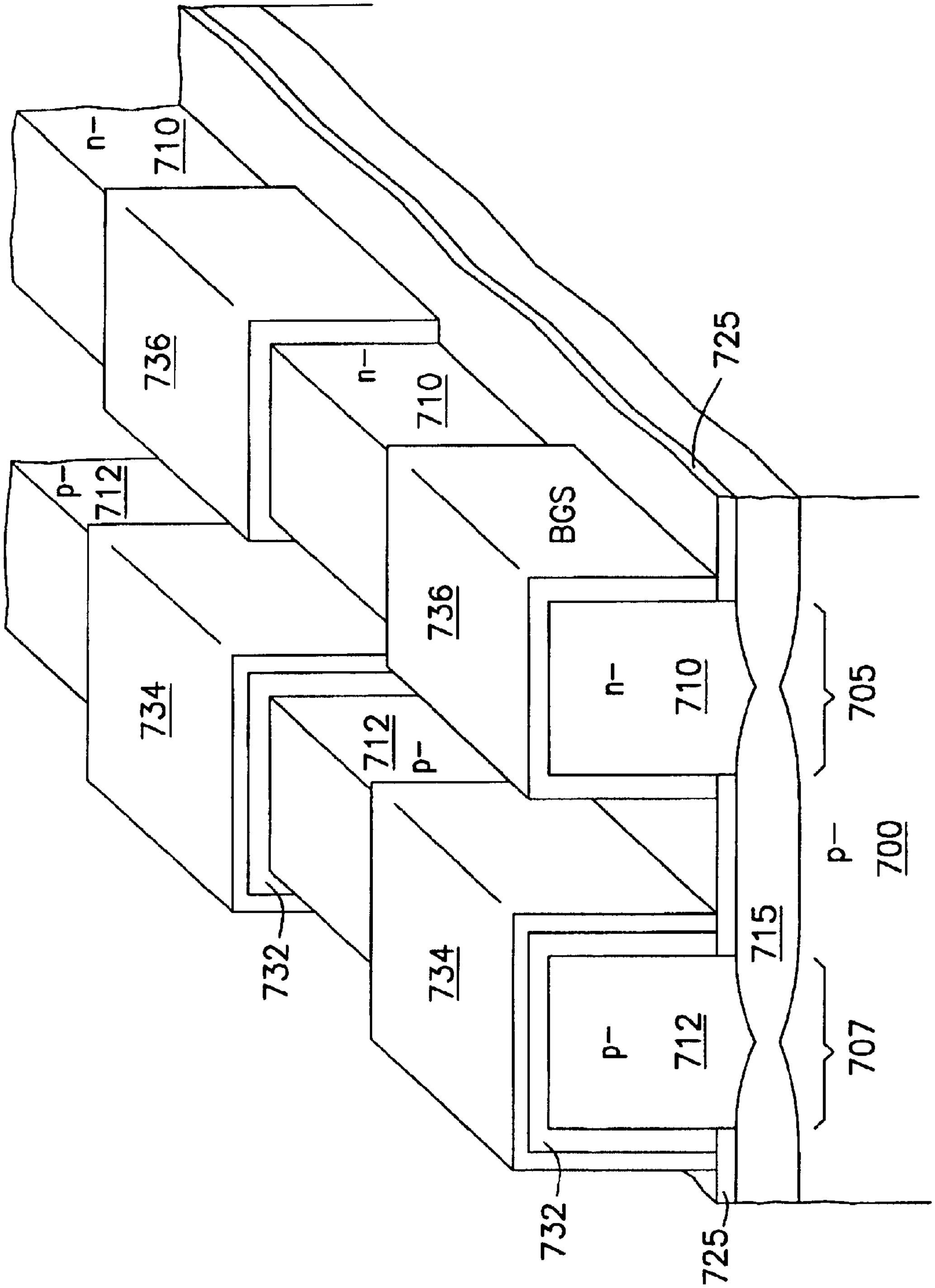

FIG. 6H illustrates the structure following the next series of process steps. The exposed p-doped glass 736 is removed by any suitable means, such as by RIE. The nitride located at the bottom of the trenches 714 again serves as an etch stop and protects the underlying insulator layer 715. Also, the thin nitride layer 734 remaining on patterned n-doped glass 732 portions serves as an etch stop and protects the regions of patterned n-doped glass 732. The photoresist is stripped using conventional stripping techniques. The structure is now as shown in FIG. 6H.

Figure 6I:
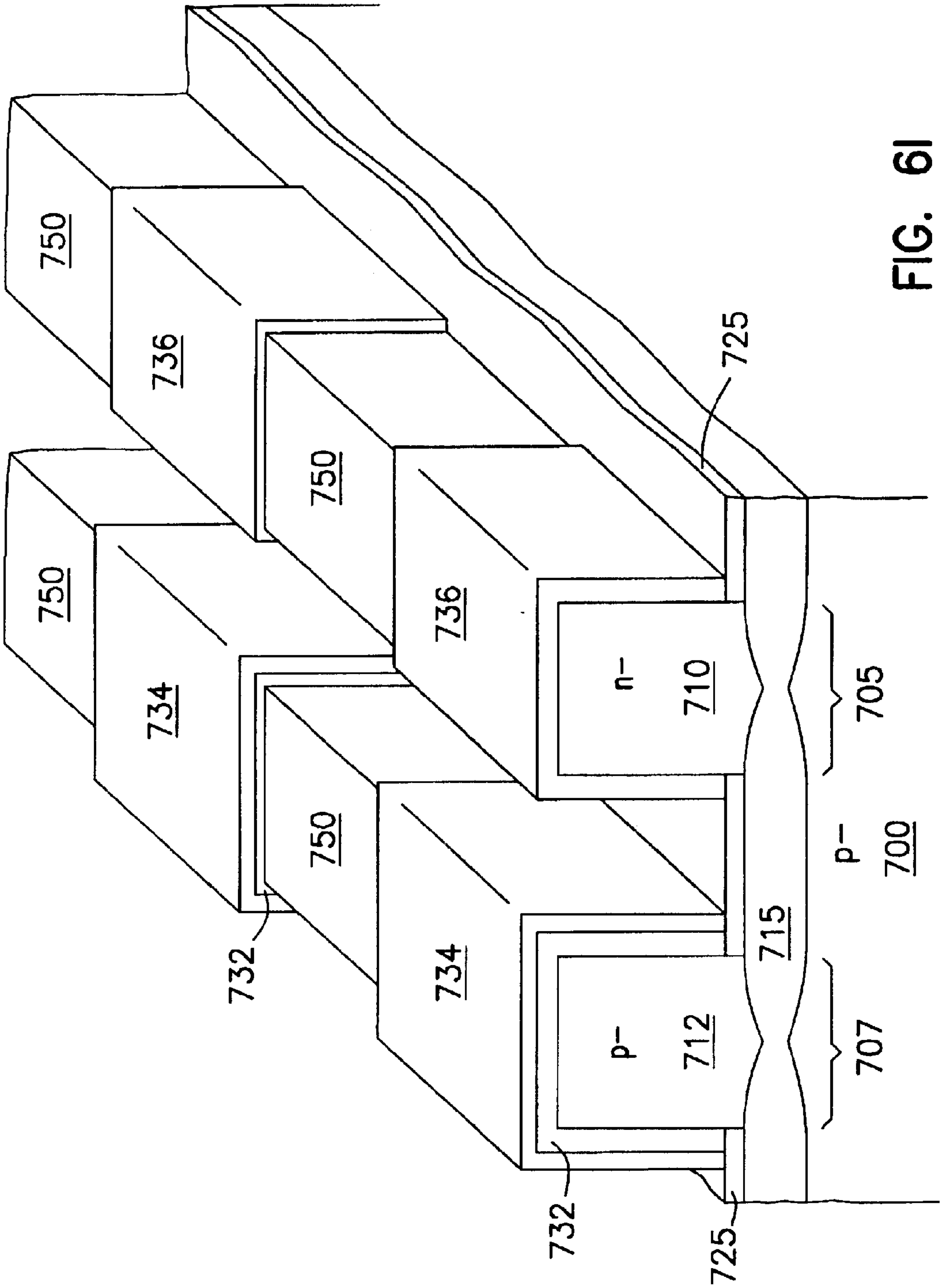

FIG. 6I provides a perspective view of the structure after the next process step. In this step a gate oxide 750 is thermally grown on the p− single crystalline silicon structure 712 of the NMOS device region 707, and on the n-well single crystalline silicon structure 710 of the PMOS device region 705.

Figure 6J:
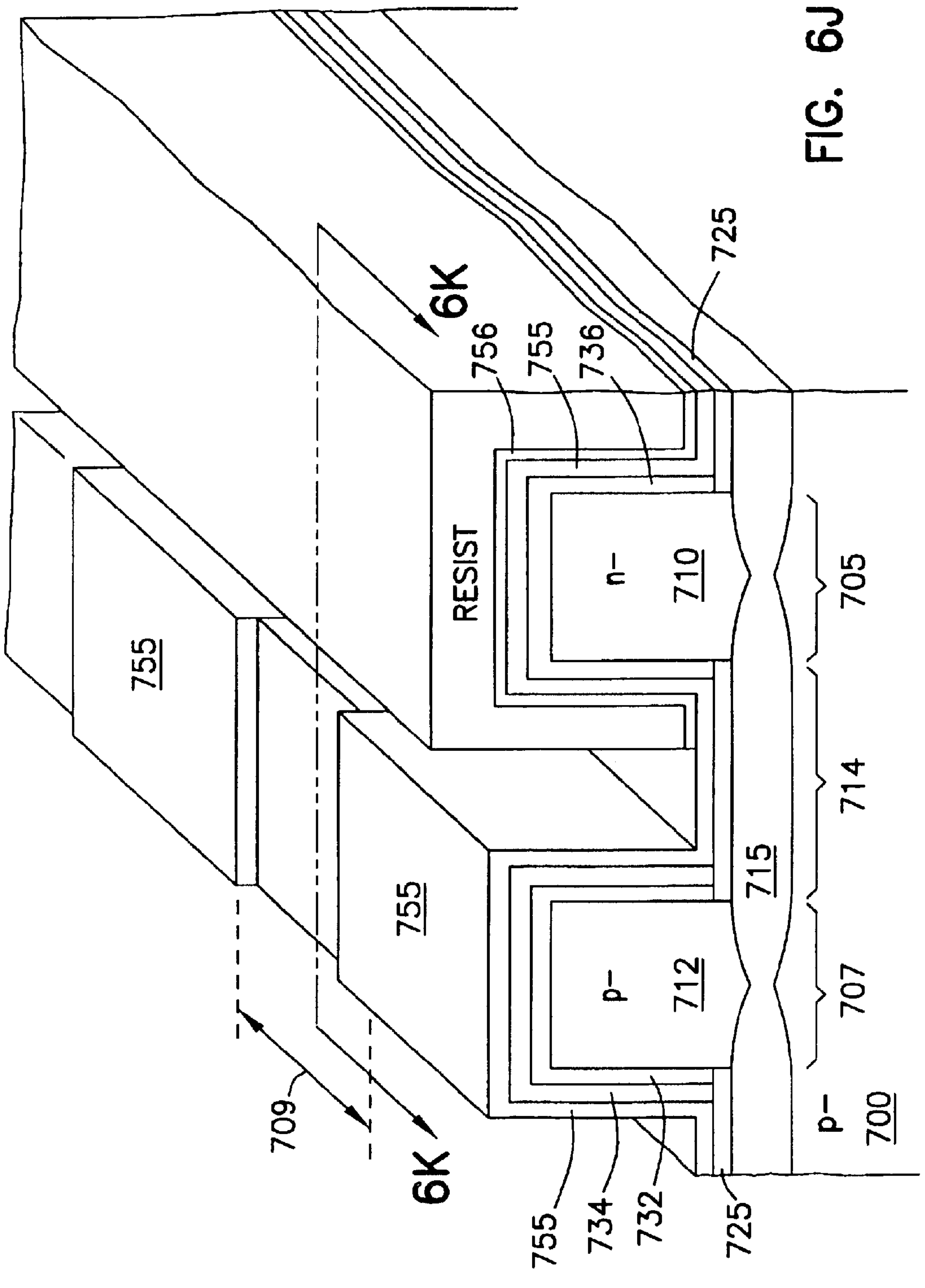

FIG. 6J carries the sequence of process steps further. In FIG. 6J, a thin intrinsic polysilicon layer 755 is deposited, such as by CVD. The intrinsic polysilicon layer 755 is formed to a thickness of approximately 50 nm. Next, a thin oxide layer 756 is deposited on the intrinsic polysilicon layer 755. The oxide layer 756 can be deposited by any suitable method, such as by CVD. The oxide layer is deposited to a thickness of approximately 10 nm. A photoresist is applied and masked to expose the NMOS device region 707. The exposed oxide layer 756 is etched back. The etching is performed by any suitable method and can be accomplished using reactive ion etching (RIE). The structure is now as appears in FIG. 6J.

Figure 6K:
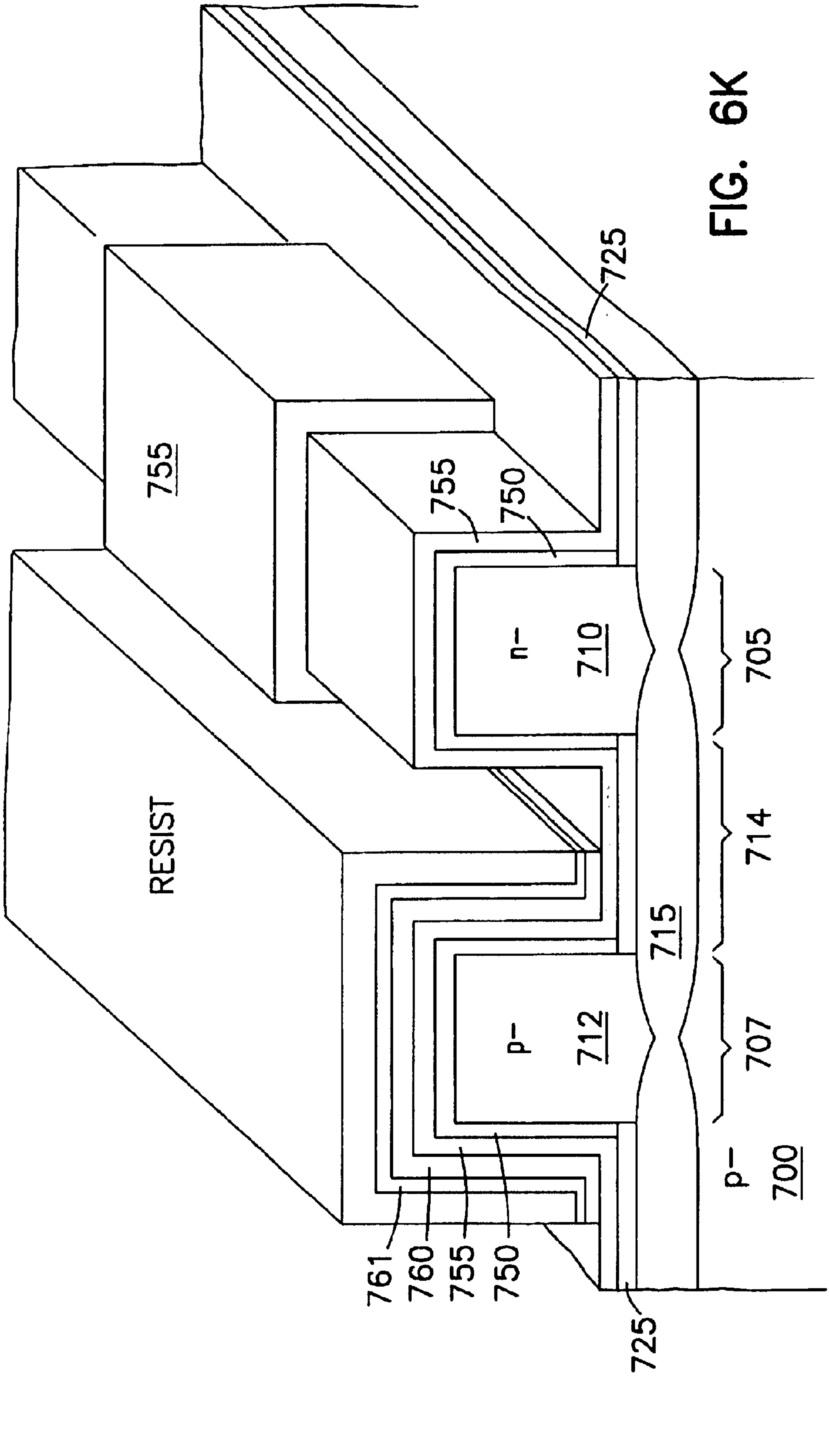

FIG. 6K illustrates the structure following the next sequence of process steps. Figure 6K is a cross-sectional view of the gate region 709 taken along cut line 6K—6K.

The photoresist has been stripped using conventional photoresist stripping techniques. Now, an n+ polysilicon layer 760 is deposited across the entire surface. The n+ polysilicon layer is deposited by any suitable means, such as by CVD. Next, a nitride layer 761 is deposited across the entire surface, such as by CVD. The nitride layer is deposited to a thickness of approximately 20 nm. A photoresist is applied and selectively exposed to reveal the PMOS device regions 705. The exposed nitride layer 761 and n+ polysilicon layer 760 underneath are etched off, such as by RIE. The exposed oxide layer 756 is next etched away by RIE. The structure is now as appears in FIG. 6K.

Figure 6L:
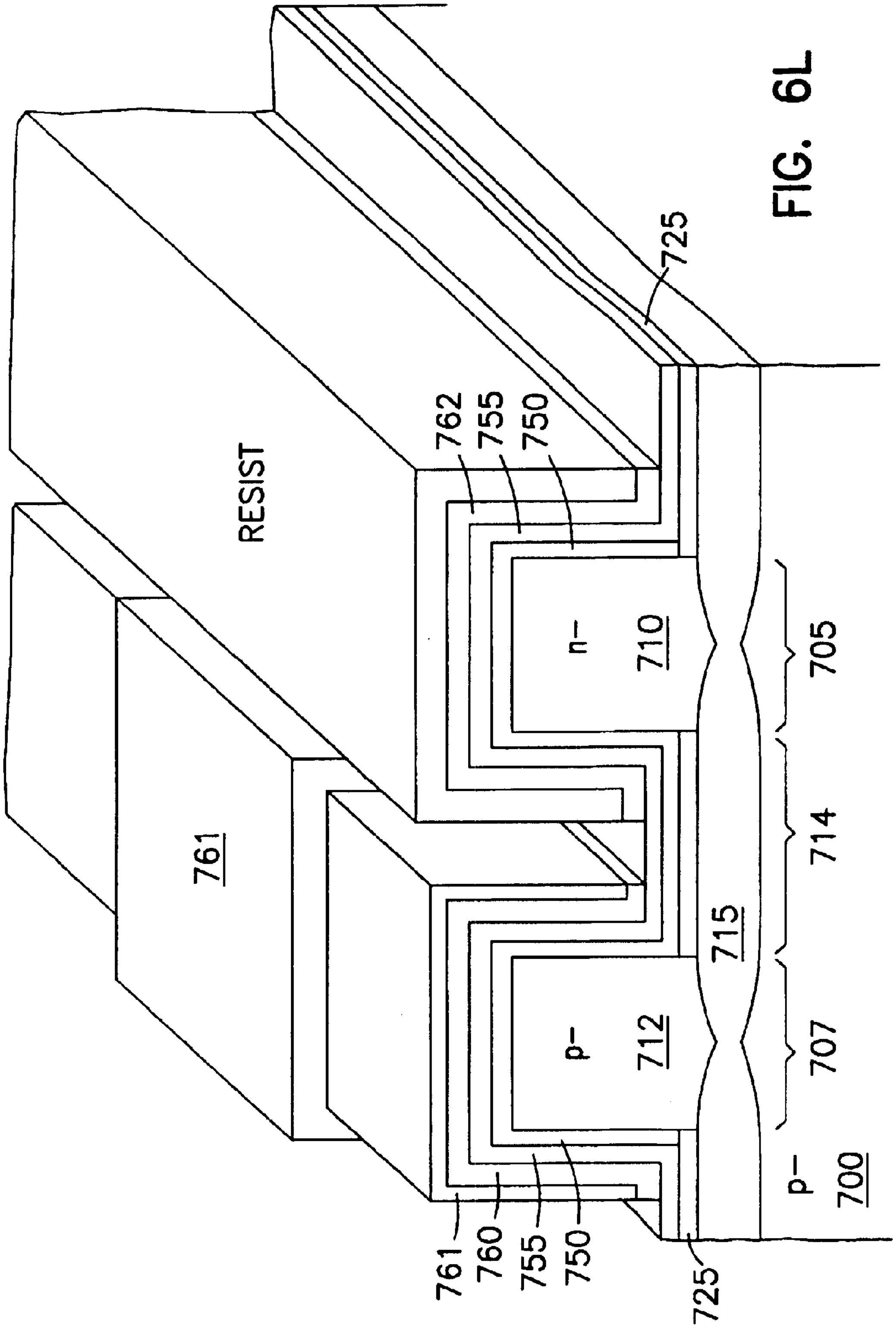

FIG. 6L illustrates the structure following the next sequence of process steps. The photoresist has been stripped using conventional photoresist stripping techniques. Now, a p+ polysilicon layer 762 is deposited across the entire surface. The p+ polysilicon layer is deposited by any suitable means, such as by CVD. A photoresist is applied and selectively exposed to reveal the NMOS device regions 707. The exposed p+ polysilicon layer 762 is etched off, such as by RIE. The structure is now as appears in FIG. 6L.

Figure 6M:
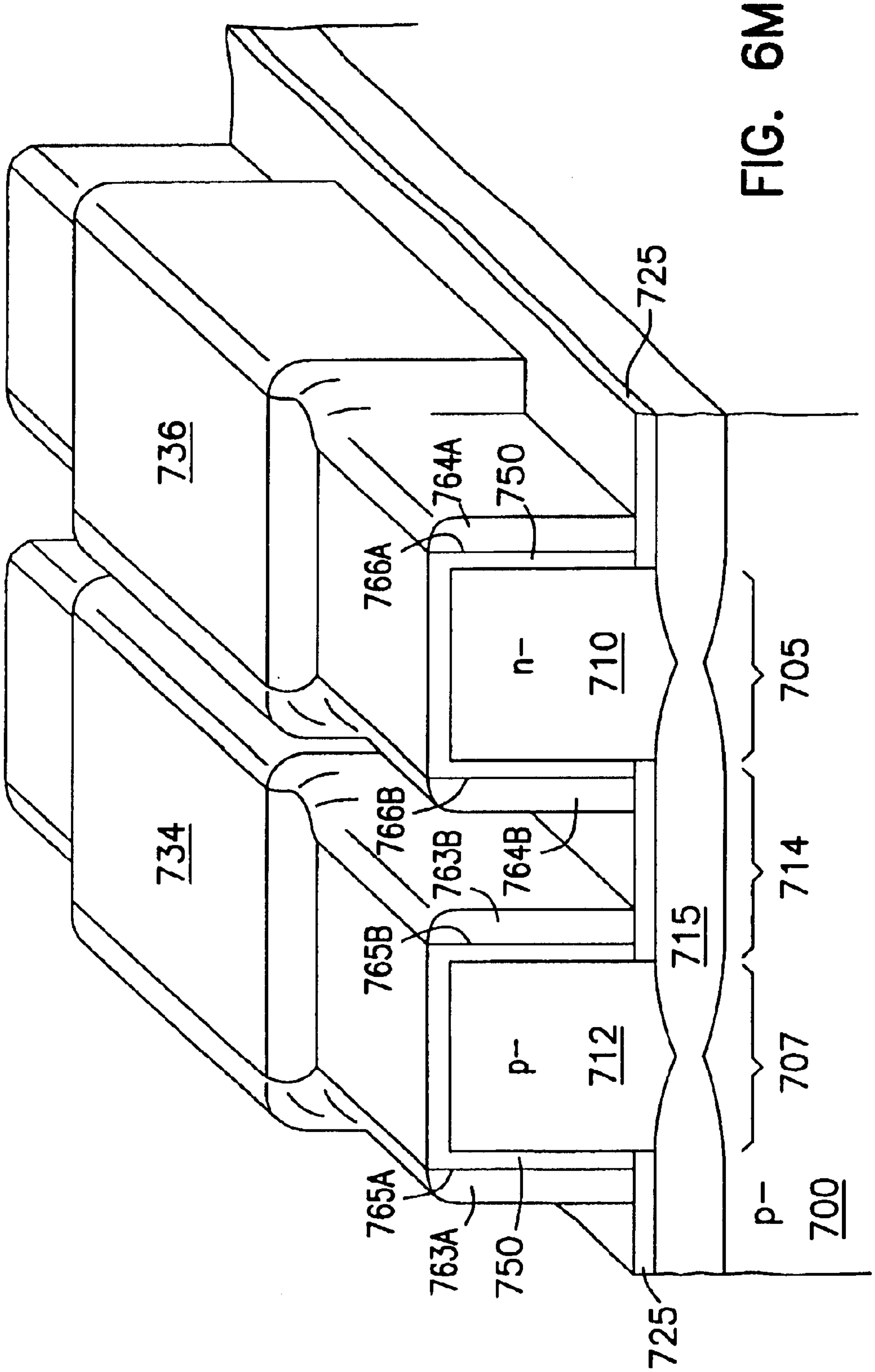

FIG. 6M illustrates the structure after the next group of process steps. The photoresist is stripped using conventional photoresist stripping techniques. The structure undergoes an anneal, such as a rapid thermal anneal (RTA), in order to drive the dopant species from the heavily doped n+ and p+ polysilicon layer, 760 and 762 respectively, into the underlying, undoped polysilicon 755. This step forms a heavily doped n+ gate layer 763 in the NMOS device region 707, and forms a heavily doped p+ silicon gate layer 764 in the PMOS device region 705. The anneal also serves to drive the dopant into the n-well single crystalline silicon structure 710 and the p− single crystalline silicon structure 712 from the p-doped glass 736 and the n-doped glass 732 respectively. The n+ and p+ polysilicon gate layers, 763 and 764 respectively, are directionally etched to leave only on the vertical side walls of the NMOS and PMOS device regions, 707 and 705. This step forms heavily doped first and second n+ gates, 763A and 763B, in the NMOS device region 707, opposite opposing sidewall surfaces, 765A and 765B respectively. Likewise, the directional etch forms heavily doped p+ silicon gates, 764A and 764B, in the PMOS device region 705, opposite opposing sidewall surfaces, 766A and 766B respectively. The structure is then as appears in FIG. 6M.

Figure 6N:
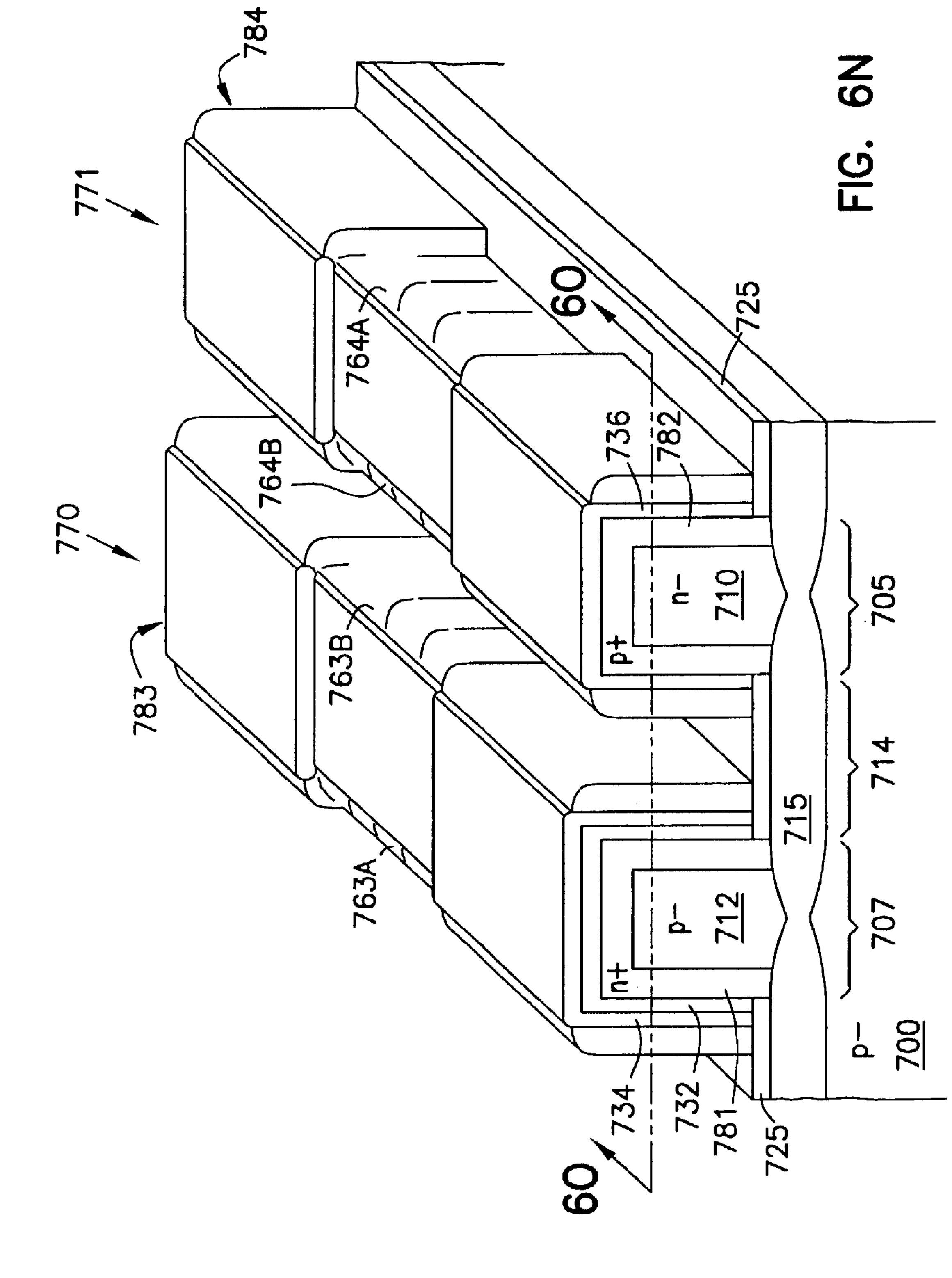
Figure 60:
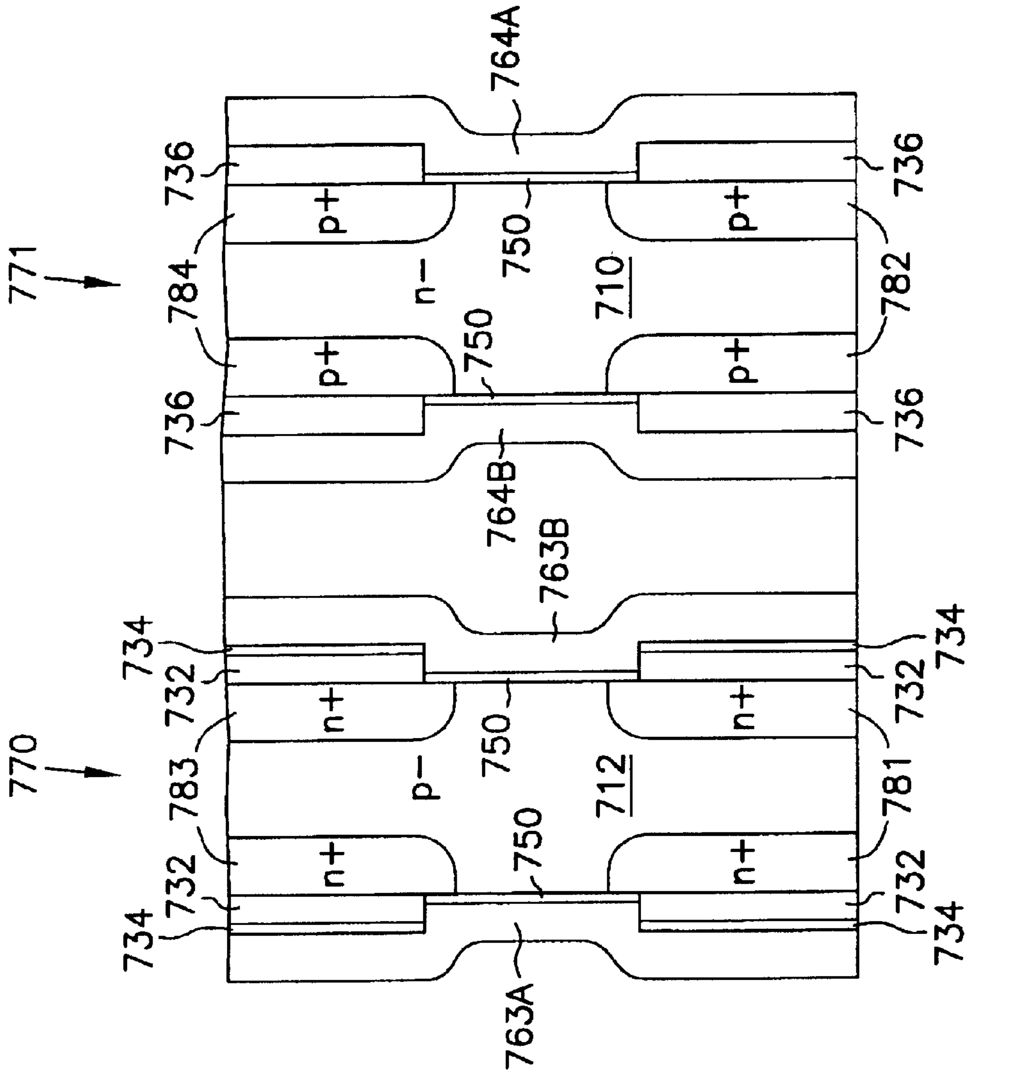

FIG. 6N provides a broader perspective view following the preceding series of process steps. FIG. 6N illustrates full length NMOS and PMOS devices, 770 and 771 respectively. FIG. 6N illustrates the location of the newly formed first source/drain regions, 781 and 782, as well as the second source/drain regions, 783 and 784, for the NMOS and PMOS devices, 770 and 771. FIG. 60 is a top view of FIG. 6N taken along cut line 6N—6N.

Finally, in a final sequence of processing steps, and following conventional method, a photoresist is applied and masked to expose any vertical walls where polysilicon 763 or 764 is to be removed to terminate gate lines. Such polysilicon 763 or 764 is then etched back by any suitable method, such as by RIE. The photoresist is stripped using conventional photoresist stripping techniques. An oxide or other insulator is deposited and planarized to fill the trenches 714 between the NMOS and PMOS devices, 770 and 771 respectively. The insulator deposition is performed by any suitable method, such as by CVD. The planarization is also achieved by any suitable technique, such as by CMP.

Contact holes and wiring for both the gate-contact and the electrical contact are formed through conventional processing steps in order to complete integrated circuit formation. One skilled in the art will recognize the method to these steps and, hence, they are not disclosed as part of this application.

Figure 7:
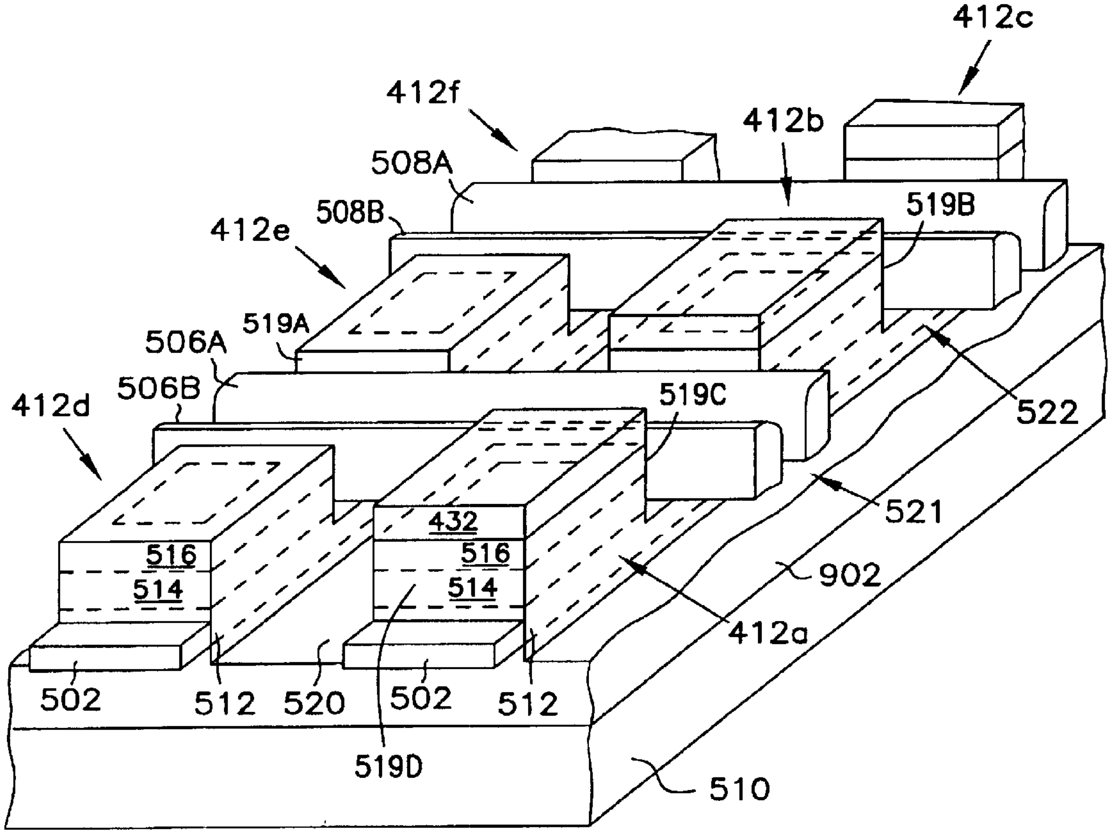
FIG. 7 is a perspective view of an embodiment of an array transistors formed according to the method of FIGS. 4A–4K and FIGS. 5A–5C.

FIG. 7 is a perspective view of an array of transistors, 412*a*, 412*b*, 412*c*, 412*d*, 412*e*, and 412*f*, formed according to the method provided in FIGS. 4A–4K and FIGS. 5A–5C. Each MOSFET in the array of transistors, 412*a*, 412*b*, 412*c*, 412*d*, 412*e*, and 412*f*, is vertically formed on a substrate 510. In one embodiment, substrate 510 is a p-type bulk silicon substrate. In another embodiment, the substrate 510 includes an insulator layer 902. Each transistor, 412*a*, 412*b*, 412*c*, 412*d*, 412*e*, and 412*f*, includes a first conductivity type, first source/drain region 512, a second conductivity type, body region 514, and a first conductivity type, second source/drain region 516. In one embodiment, the first source/drain region is formed by ion implantation of a p-type dopant into the substrate 510. Another embodiment, includes forming the first source/drain region 512 by vertically growing a p-type epitaxial layer from the substrate 510. In an alternate embodiment, the first source/drain region 512 is formed by vertically growing an n-type epitaxial layer from the substrate 510. In still another embodiment, the first source/drain region 512 is formed by first ion implanting a dopant into the substrate and then vertically growing an epitaxial layer. Each body region 514 has opposing sidewall surfaces and is vertically formed on the first source/drain region 512 by vertically growing an epitaxial layer according to the method provided FIGS. 4A–4K and FIGS. 5A–5C. Each second source/drain region 516 is formed on the vertical body region 514 in an identical manner to the first source/drain region 516. Each body region 514 is formed sufficiently thin, vis-a-vis the doping concentration, such that the body region 514 can be fully depleted when a potential is applied to the body region 514.

Focusing on transistors 412*b* and 412*e*, FIG. 7 illustrates a first gate 506A provided in trench 521. The first gate 506A opposes a first one 519A of the opposing sidewall surfaces, 519A and 519B, for the body regions 514 of transistors 512*b* and 512*e*. In FIG. 7, a second gate 508B is provided in trench 522. The second gate 508B opposes a second one 519B of the opposing sidewall surfaces, 519A and 519B, for the body regions 514 of transistors 412*b* and 412*e*. Fully depleting the body regions 514 is controlled by the synchronous bias of the first and second gates, 506A and 508B. In one embodiment, the first gate 506A and second gate 508B are independently operable and can be biased from separate sources. In an alternative embodiment, the first gate 506A and second gate 508B are biased from a single source.

Focusing on transistors 412*a* and 412*d*, a first gate 506B is provided in trench 521. The first gate 506B opposes a first one 519C of the opposing sidewall surfaces, 519C and 519D, for transistors 412*a* and 412*d*. First gates 506A and 506B are independent and electrically isolated from one another.

Figure 8:
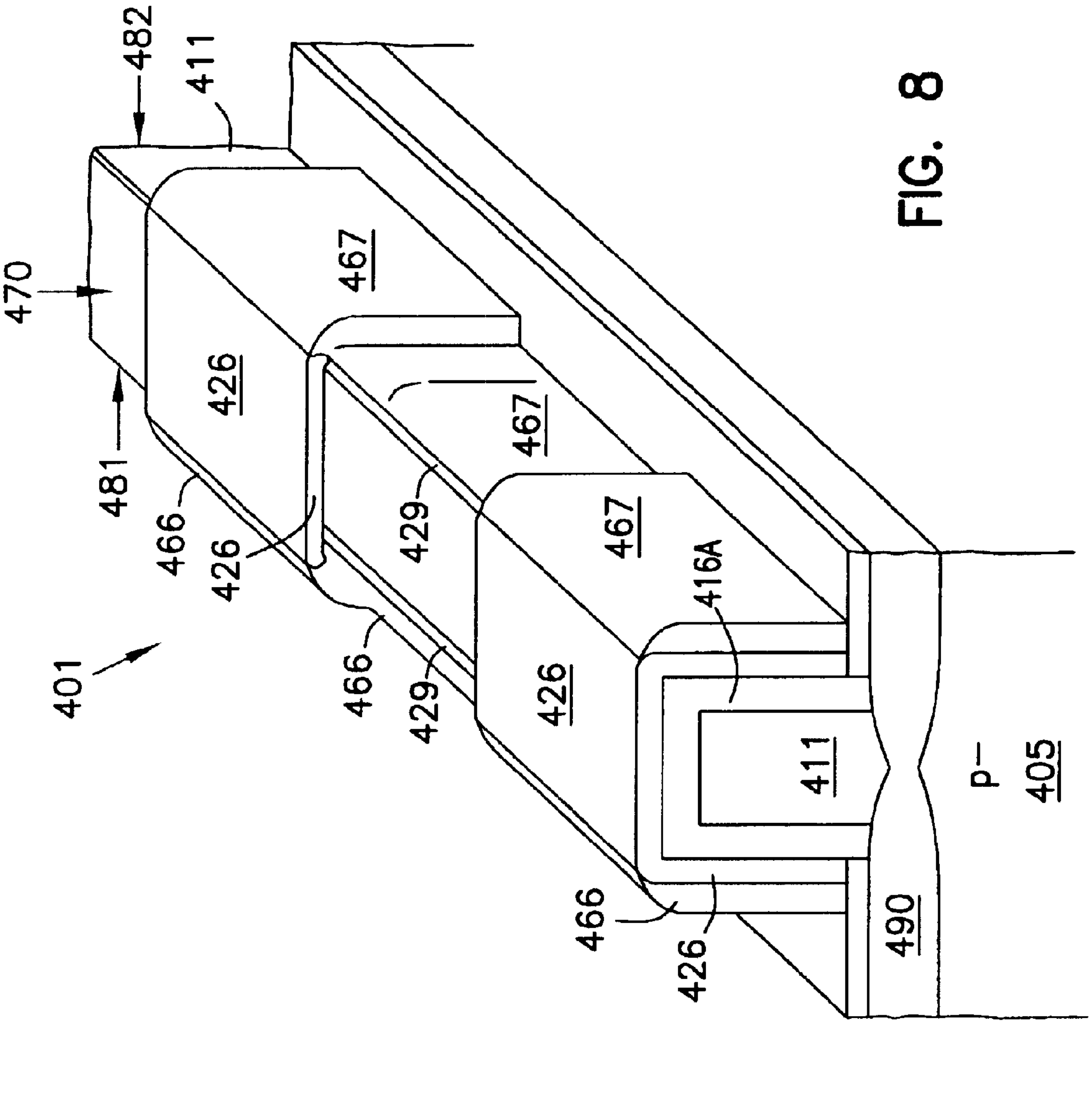
FIG. 8 is a perspective view of an embodiment of transistor formed according to the method of FIGS. 6A–6O.

FIG. 8 is a perspective view of a MOSFET 401 formed according to the method provided in FIGS. 6A–6N. The MOSFET 401 represents either an n-channel MOSFET (NMOS), or a p-channel MOSFET (PMOS) depending on a selected doping profile as will be understood by one of ordinary skill in the art of semiconductor fabrication. The MOSFET 401 includes a vertically formed body region 411 that extends outwardly from a substrate 405 of p− silicon material. In one embodiment, the body region 411 is formed on an insulator layer 490 formed on the substrate 405. The body region 411 has an upper surface 470 and opposing sidewall surfaces, 481 and 482 respectively. The body region 411 is formed sufficiently thin, vis-a-vis the doping concentration, such that the body region 411 can be fully depleted when a potential is applied to the body region 411. In the PMOS embodiment, the body region 411 is formed of a p− silicon material. In the NMOS embodiment, the body region 411 is formed of an n− silicon material.

A first source/drain region 416A is formed adjacent to the upper surface 470 and the opposing sidewall surfaces, 481 and 482, of the body region 411. Forming the first source/drain region 416A adjacent to the body region 411 includes encasing a portion of the body region 411 with a doped glass layer 426. In the NMOS embodiment, the doped glass layer 426 can be eiiher an Arsenic silicate glass (ASG), or phosphorus silicate glass (PSG). The doped glass layer 426 is deposited by chemical vapor deposition (CVD) and then annealed to form the n-type layer of doped silicon material on the body region 411. In the PMOS embodiment, forming the first source/drain region 416A adjacent to the body region 411 includes encasing a portion of the body region 411 with a doped glass layer 426 of Borosilicate glass (BSG). The BSG is deposited by CVD and then annealed to form the p-type layer of doped silicon material on the body region 411.

Similarly, a second source/drain region 416B is formed adjacent to the upper surface 470 and the opposing sidewall surfaces, 481 and 482, of the body region 411. The second source/drain region 416B is formed in a fashion which appropriately accords to forming the first source/drain region 416A, as will be understood by one of ordinary skill in the art of semiconductor fabrication. The MOSFET 401 further includes a gate oxide layer 429 located on the opposing sidewalls, 481 and 482. A first gate 466 is formed on the gate oxide 429 on a first one 481 of the opposing sidewalls surfaces, 481 and 482, of the body region 411. A second gate 467 is formed on the gate oxide 429 on a second one 482 of the opposing sidewalls surfaces, 481 and 482, of the body region 411. The oxide layer 429 and the first and second gates, 466 and 467 respectively, are formed according to the method taught in connection with FIGS. 6A–6N.

Figure 9:
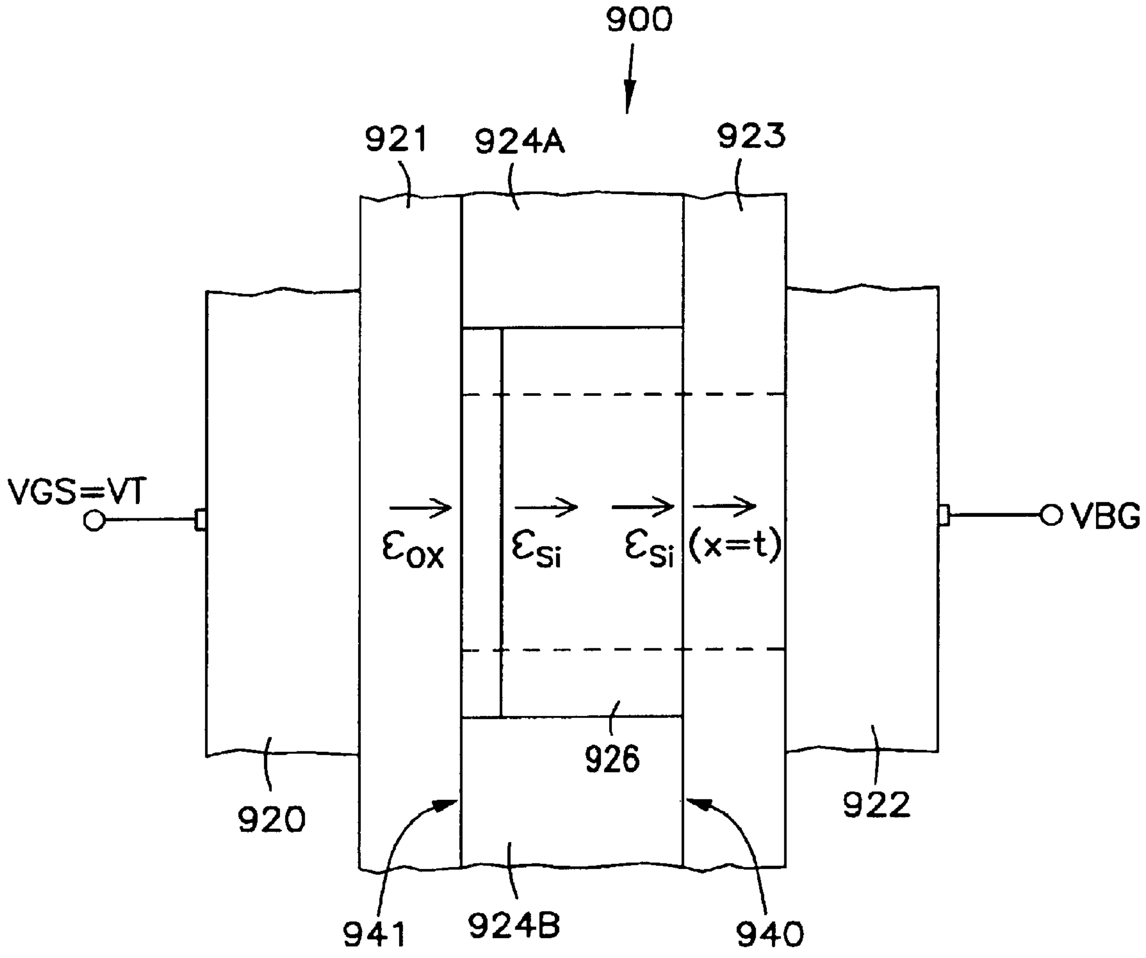
FIG. 9 is a planar view of an embodiment of a dual-gated transistor according to the teachings of the present invention.

FIG. 9 is a planar view of an embodiment of a transistor according to the teachings of the present invention. FIG. 9 illustrates a dual gated transistor 900. The dual gated transistor has a first source/drain region 924A, a body region 926, and a second source/drain region 924B. The body region 926 has opposing sidewall surfaces, 941 and 940 respectively, and the body region 926 includes a fully depleted structure. A first gate 920 is located on a first one 941 of the opposing sidewall surfaces, 941 and 940 respectively. A second gate 922 is located on a second one 940 of the opposing sidewall surfaces, 941 and 940 respectively. The threshold voltage (Vt) for the dual-gated transistor 900 is not dependent on bulk charge in the body region 926. This feature, or aspect, of the present invention is best understood by comparing the following equations and schematic representations with FIG. 9.

The threshold voltage for a conventional MOSFET is given by Equation 1, $$VT=|2\Phi_f|+|QB/Cox| \tag{1}$$

where QB=q NA Wd, and is the relatively large bulk charge in the surface depletion or space charge region. For simplicity, this equation assumes an idealized structure with no oxide charge or work function differences. Note that the threshold voltage (Vt) depends directly on the magnitude of the term, QB/Cox. This term is significant and normally is of the same order of magnitude as the first term, $2\Phi_f$. Fluctuations in QB will result in fluctuations of the threshold voltage (Vt). This is not the case for the fully depleted dual gated structure in FIG. 9.

The following equations outline the same type of calculation for the threshold voltage (Vt) of a fully depleted dual gated structure. In the fully depleted dual-gated structure, $$VT=|2\Phi_f|+\left[|QB|+\frac{Esi\ Eox(|2\Phi_f|-VBG-|QB/2Csi|)}{(Esi\ tox+Eox\ tsi)}\right]/Cox \tag{2}$$

This equation again assumes an idealized structure with no oxide charge or work function differences. Note that in Equation 2, the threshold voltage can now be controlled by the backgate bias voltage, VBG. A negative bias on the backgate will increase the front gate threshold voltage (Vt). Note also that if QB is small, the doping, NA, is low and/or the thickness, tsi, is small, then (Vt) does not depend strongly on QB. Equation 2 can also be written, $$VT=|2\Phi_f|+\left[|QB|+\frac{Csi\ Cos(|2\Phi_f|-VBG-|QB/2Csi|)}{(Csi+Cos)}\right]/Cox \tag{3}$$

In the limiting case as QB approaches zero then, $$VT=|2\Phi_f|+\frac{Csi}{Csi+Cox}(|2\Phi_f|-VBG) \tag{4}$$

This equation just represents three capacitors in series, the front gate oxide 921, the capacitance of the silicon body region 926, and the backgate oxide 923, as illustrated below;

(5)

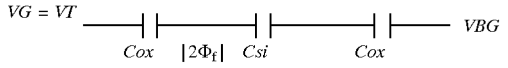

and this can be reduced to two capacitors in series;

(6)

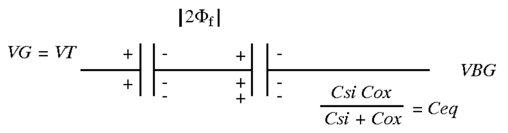

and then the charge, QBD, found on these two capacitors.

$$QBD=(|2\Phi_f|-VBG)Ceq \tag{7}$$

One can then calculate the voltage drop across the front gate oxide 621, ΔV=QBD/Cox, $$\Delta V=\frac{Csi}{Csi+Cox}(|2\Phi_f|-VBG) \tag{8}$$

and finally the gate voltage (Vt) at threshold for the front gate.

$$VT=VG=|2\Phi_f|+\frac{Csi}{Csi+Cox}(|2\Phi_f|-VBG) \tag{9}$$

In this limiting case, the threshold voltage (Vt) depends only on the thickness of the oxides, 921 and 923, and silicon body region 926 and not at all on the bulk charge. It becomes apparent in this case that the threshold voltage (Vt) can be made insensitive to fluctuations in dopant atom concentrations. The threshold voltage (Vt) is controlled by the backgate voltage, VBG, which can be accurately set.

An improved method and structure are provided for MOSFETs which reduce or eliminate the effects of statistical dopant fluctuations. The structure includes a dual-gated FET which can be fabricated according to a novel processing sequence, but uses current fabrication line CMOS processing tools and process techniques. Hence the invention does not require any additional masks, forms, or an increase in the number of process steps. The dual-gated MOSFET has two gates one on each side of a thin fully depleted silicon structure, or body region. The small volume, or thin width, of the body of the dual-gated transistor allows the device to be fully depleted in MOSFET operation. In effect, the bulk charge in the body region is extremely small, negligible in device operation, and therefore the threshold voltage ($V_t$) does not depend on statistical fluctuations in dopant atom concentrations. The improved method and structure facilitate a future generation of sub 0.5 $\mu$m, uniform, and low threshold voltage ($V_t$) devices. The improved method and structure additionally facilitate an increased range of applications for sub-0.5 $\mu$m MOSFETs which include use in producing drivers and clock drivers with uniform characteristics and delays.

CONCLUSION

An improved structure and method are provided for a signal processing circuit. The signal processing circuit is fabricated using current CMOS processing techniques. The structure includes dual-gated MOSFET, which means a fully depleted dual-gated MOSFET that has two gates one on each side of a thin fully depleted silicon structure. The silicon film between the two gates is very thin so the device can be fully depleted. The dual-gated MOSFET is not simply two distinctly different FETs operating in parallel, but rather the threshold voltage of one gate of the dual-gated MOSFET depends on the bias of the other gate. Thus, the dual-gated MOSFET operates as one singular device structure where the current depends on the potential of both the front gate and the back gate. This yields a small signal component in analog circuit applications which depends on the product of the signals applied to the gates, and not one which depends on the sum of the two signals.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A method of fabricating a transistor on a substrate, the method comprising:

forming a first source/drain region on the substrate;

vertically forming a body region on the first source/drain region as a fully depleted structure, forming a second source/drain region on the body region to form a column on the substrate, the body region having opposing sidewall surfaces on the column;

forming a first gate on a first one of the opposing sidewall surfaces after forming the column, the first gate separated from the first one of the opposing sidewall surfaces by a first oxide layer; and forming a second gate on a second one of the opposing sidewall surfaces after forming the column, the second gate separated from the second one of the opposing sidewall surfaces by a second oxide layer, wherein vertically forming the body region includes vertically growing an epitaxial layer such that the body region is formed having a width and a doping concentration such that a threshold voltage is substantially independent of bulk charge in the body region in transistor operation.

2. The method of claim 1, wherein fabricating a transistor includes fabricating the transistor on a p-type bulk silicon substrate.

3. The method of claim 1, wherein forming the body region includes forming the body region having a thickness of less than 0.2 microns.

4. The method of claim 1, wherein forming the transistor includes forming the body region having a thickness of about 0.4 microns.

5. The method of claim 1, wherein forming the first source/drain region includes forming the first source/drain region using ion implantation.

6. The method of claim 1, wherein forming the first source/drain region includes vertically growing an epitaxial layer.

7. The method of claim 1, wherein forming the first source/drain region includes using ion implantation and includes vertically growing an epitaxial layer.

8. The method of claim 1, wherein the method further includes forming an insulating layer between the first source/drain region and the substrate.

9. The method of claim 1, wherein forming a body region includes forming the body region such that the body region is not formed across surfaces other than a surface of the first source/drain region.

10. The method of claim 1, vertically growing an epitaxial layer such that the body region is formed having a width and a doping concentration such that a threshold voltage is substantially independent of bulk charge in the body region in transistor operation includes forming the body region with a width and doping such that a threshold voltage is insensitive to fluctuations in the doping concentration.

11. A method of fabricating a transistor on a substrate, the method comprising:

forming a first source/drain region on the substrate;

vertically forming a body region on the first source/drain region;

forming a second source/drain region on the body region to form a column on the substrate, the body realon having opposing sidewall surfaces on the column;

forming a first gate on a first one of the opposing sidewall surfaces after forming the column, the first gate separated from the first one of the opposing sidewall surfaces by a first oxide layer; and forming a second gate on a second one of the opposing sidewall surfaces after forming the column, the second gate separated from the second one of the opposing sidewall surfaces by a second oxide layer, wherein vertically forming the body region includes vertically growing an epitaxial layer such that the body region is formed as a single crystalline structure having a width and a doping concentration such that a threshold voltage of the transistor is substantially independent of bulk charge in the body region in transistor operation, and the body region, the first gate, and the second gate are formed such that biasing the first and the second gates fully depletes the body region.

12. The method of claim 11, wherein the method further includes forming an insulating layer between the first source/drain region and the substrate.

13. A method of fabricating a transistor on a substrate, the method comprising:

forming a first conductivity type first source/drain region on the substrate;

vertically forming a second conductivity type body region on the first source/drain layer, forming a first conductivity type second source/drain region on the body region layer to form a column on the substrate, the body region having opposing sidewall surfaces on the column;

forming a first gate on a first one of the opposing sidewall surfaces after forming the column, the first gate separated from the first one of the opposing sidewall surfaces by a first oxide layer; and forming a second gate on a second one of the opposing sidewall surfaces after forming the column, the second gate separated from the second one of the opposing sidewall surfaces by a second oxide layer, wherein vertically forming the body region includes vertically growing an epitaxial layer such that the body region is formed as a fully depleted structure with a single crystalline structure having a width and a doping concentration such that a threshold voltage of the transistor is substantially independent of bulk charge in the body region in transistor operation.

14. The method of claim 13, wherein forming a first conductivity type first source/drain region includes vertically growing a p-type epitaxial layer.

15. The method of claim 13, wherein forming a first conductivity type first source/drain region includes vertically growing an n-type epitaxial layer.

16. The method of claim 13, wherein vertically forming a second conductivity type body region includes forming, wherein forming the second conductivity type body region having a thickness of less than 0.2 microns.

17. The method of claim 13, wherein the method further includes forming an insulating layer between the first conductivity type first source/drain region and the substrate.

18. A method of fabricating a transistor on a substrate, the method comprising:

vertically growing an n-type epitaxial first source/drain region on the substrate;

vertically forming a second conductivity type body region on the first source/drain layer as a fully depleted structure;

vertically growing an n-type epitaxial second source/drain region on the body region layer to form a column on the substrate, the body region having opposing sidewall surfaces on the column;

forming a first gate on a first one of the opposing sidewall surfaces after forming the column, the second gate separated from the first one of the opposing sidewall surfaces by a first oxide layer; and forming a second gate on a second one of the opposing sidewall surfaces after forming the column, the second gate separated from the second one of the opposing sidewall surfaces by a second oxide layer, wherein vertically forming the body region includes vertically growing an epitaxial layer such that the body region is formed as a fully depleted structure with a single crystalline structure having a width and a doping concentration such that a threshold voltage is substantially independent of bulk charge in the body region in transistor operation.

19. The method of claim 18, wherein the method further includes forming an insulating layer between the n-type epitaxial first source/drain region and the substrate.

20. A method of fabricating a transistor on a substrate, the method comprising:

forming an isolated vertical device region extending outwardly from the substrate, the isolated vertical device region formed as a region of semiconductor material;

forming a body region in the vertical device region extending outwardly from the substrate, wherein vertically forming the body region includes forming the body region with opposing sidewall surfaces;

forming a first source/drain region adjacent to the body region;

forming a second source/drain region adjacent to the body region;

forming a first gate on a first one of the opposing sidewall surfaces separated from the first one of the opposing sidewall surfaces by a first oxide layer; and forming a second gate on a second one of the opposing sidewall surfaces separated from the second one of the opposing sidewall surfaces by a second oxide layer, the body region, the first and second source/drain regions, and the first and second gates being formed after forming the isolated vertical device region, wherein vertically forming the body region includes forming the body region as a fully depleted structure with a single crystalline structure having a width and a doping concentration such that a threshold voltage is substantially independent of bulk charge in the body region in transistor operation.

21. The method of claim 20, wherein fabricating a transistor on a substrate includes fabricating the transistor on an insulator layer.

22. The method of claim 20, wherein forming a first source/drain region adjacent to the body region includes encasing a portion of the body region with Arsenic silicate glass (ASG) and annealing the ASG.

23. The method of claim 22, wherein encasing a portion of the body region with Arsenic silicate glass (ASG) includes depositing the ASG using chemical vapor deposition (CVD).

24. The method of claim 20, wherein forming a first source/drain region adjacent to the body region includes encasing a portion of the body region with Borosilicate silicate glass (BSG) and includes annealing the BSG.

25. The method of claim 24, wherein encasing a portion of the body region with Borosilicate silicate glass (BSG) includes depositing the BSG using chemical vapor deposition (CVD).

26. The method of claim 20, wherein forming a first source/drain region adjacent to the body region includes forming the first source/drain region on the substrate and along the body region.

27. The method of claim 20, wherein forming a first source/drain region adjacent to the body region and forming a second source/drain region adjacent to the body region includes forming the first source/drain region adjacent and the second source/drain region on a common level on the substrate.

28. A method of fabricating a transistor on a substrate, the method comprising:

forming an isolated vertical device region extending outwardly from the substrate, the isolated vertical device region formed as a region of semiconductor material;

vertically forming a body region in the vertical device region extending outwardly from the substrate, and wherein vertically forming the body region includes forming the body region with opposing sidewall surfaces;

forming a first source/drain region adjacent to the body region, wherein forming the first source/drain region adjacent to the body region includes encasing a portion of the body region with Arsenic silicate glass (ASG) and annealing the ASG;

forming a second source/drain region adjacent to the body region, wherein forming the second source/drain region adjacent to the body region includes encasing a portion of the body region with Arsenic silicate glass (ASG) and annealing the ASG;

forming a first gate on a first one of the opposing sidewall surfaces separated from the first one of the opposing sidewall surfaces by a first oxide layer; and forming a second gate on a second one of the opposing sidewall surfaces separated from the second one of the opposing sidewall surfaces by a second oxide layer, the body region, the first and second source/drain regions, and the first and second gates being formed after forming the isolated vertical device region, wherein vertically forming the body region includes forming the body region as a fully depleted structure with a single crystalline structure having a width and a doping concentration such that a threshold voltage is substantially independent of bulk charge in the body region in transistor operation.

29. The method of claim 28, wherein forming a first source/drain region adjacent to the body region includes forming a first source/drain region adjacent to the body region includes forming the first source/drain region on the substrate and along the body region.

30. The method of claim 28, wherein forming a first source/drain region adjacent to the body region and forming a second source/drain region adjacent to the body region includes forming the first source/drain region adjacent and the second source/drain region on a common level on the substrate.

31. The method of claim 28, wherein the method further includes forming an insulating layer between the body region and the substrate.

32. A method of forming a dual-gated transistor on a substrate, comprising:

forming a first source/drain region on the substrate;

vertically forming a body region with a fully depleted structure on the first source/drain region, forming a second source/drain region on the body region to form a column on the substrate;

forming a first gate on a first one of opposing sidewall surfaces of the body region after forming the column, the first gate separated from the first one of the opposing sidewall surfaces by a first oxide layer; and forming a second gate on a second one of the opposing sidewall surfaces after forming the column, the second gate separated from the second one of the opposing sidewall surfaces by a second oxide layer, wherein vertically farming the body region includes vertically growing an epitaxial layer such that the body region is formed as a single crystalline structure having a width and a doping concentration such that a threshold voltage for the transistor depends only on a thickness of the first and second oxides and the width of the body region.

33. The method of claim 32, including fabricating the dual-gated transistor on a p-type bulk silicon substrate.

34. The method of claim 32, including forming the body region, the first gate, and the second gate such that biasing the first and the second gates fully depletes the body region.

35. The method of claim 32, including forming the first source/drain region using ion implantation.

36. The method of claim 32, wherein forming the first source/drain region includes vertically growing an epitaxial layer.

37. The method of claim 32, wherein forming the first source/drain region includes using ion implantation and includes vertically growing an epitaxial layer.

38. The method of claim 32, wherein the method further includes forming an insulating layer between the body region and the substrate.

* * * * *

UNITED STATES PATENT AND TRADEMARK OFFICE

CERTIFICATE OF CORRECTION

PATENT NO. : 6,964,903 B2

APPLICATION NO. : 10/057225

DATED : November 15, 2005

INVENTOR(S) : Forbes et al.

It is certified that error appears in the above-identified patent and that said Letters Patent is hereby corrected as shown below:

On the Title Page, in field (56), under "Other Publications", in column 2, line 2, delete "Cisuit" and insert - - Circuit - -, therefor.

On page 2, in field (56), under "Other Publications", in column 1, lines 9 – 10, delete "Technolgy" and insert - - Technology - -, therefor.

On page 2, in field (56), under "Other Publications" in column 2, line 3, delete "433-338" and insert - - 433-438 - -, therefor.

On page 2, in field (56), under "Other Publications", in column 2, line 5, delete "Theshold" and insert - - Threshold - -, therefor.

In column 1, line 9, delete "6,413,825Jul." and insert --6,413,825 on Jul. --, therefore.

In column 1, line 10, delete "09/1 45,100" and insert - - 09/145,100 - -, therefor.

In column 1, line 11, delete "Aug." and insert -- on Aug.--

In column 4, line 39, after "extends" insert - - outwardly from a semiconductor substrate. The dual-gated MOSFET includes a first and a - -.

In column 4, line 41, after "has opposing" insert - - sidewall surfaces. The body region is formed of a fully depleted structure. A first gate is located - -.

In column 15, line 13, delete "eiiher" and insert - - either - -, therefor.

In column 17, line 67, in Claim 1, after "structure" delete "," and insert - - ; - -, therefor.

UNITED STATES PATENT AND TRADEMARK OFFICE

CERTIFICATE OF CORRECTION

PATENT NO. : 6,964,903 B2 
APPLICATION NO. : 10/057225
DATED : November 15, 2005
INVENTOR(S) : Forbes et al.

It is certified that error appears in the above-identified patent and that said Letters Patent is hereby corrected as shown below:

In column 18, line 56, in Claim 11, delete “realon” and insert - - region - -, therfor.

In column 19, line 16, in Claim 13, after “layer” delete “,” and insert - - ; - -, therefor.

In column 22, line 12, in Claim 32, after “region” delete “,” and insert - - ; - -, therfor.

In column 22, line 24, in Claim 32, delete “farming” and insert - - forming - -, therefor.

Signed and Sealed this

Eighth Day of August, 2006

JON W. DUDAS
*Director of the United States Patent and Trademark Office*